United States Patent
Ryu et al.

(10) Patent No.: US 10,712,662 B2
(45) Date of Patent: Jul. 14, 2020

(54) METHODS OF FORMING PATTERNS USING COMPOSITIONS FOR AN UNDERLAYER OF PHOTORESIST

(71) Applicants: Samsung Electronics Co., Ltd., Suwon-si (KR); Dongjin Semichem Co., Ltd., Seoul (KR)

(72) Inventors: Jin-A Ryu, Hwaseong-si (KR); Jung-Youl Lee, Hwaseong-si (KR); Kyung-Lyul Moon, Seoul (KR); Yool Kang, Yongin-si (KR); Hyun-Jin Kim, Hwaseong-si (KR); Yu-Jin Jeoung, Hwaseong-si (KR); Man-Ho Han, Hwaseong-si (KR)

(73) Assignees: SAMSUNG ELECTRONICS CO., LTD., Samsung-ro, Yeongtong-gu, Suwon-si, Gyeonggi-do (KR); DONGJIN SEMICHEM CO., LTD., Mapo-gu, Seoul (KR)

( * ) Notice: Subject to any disclaimer, the term of this patent is extended or adjusted under 35 U.S.C. 154(b) by 422 days.

(21) Appl. No.: 15/405,612

(22) Filed: Jan. 13, 2017

(65) Prior Publication Data

US 2017/0199459 A1    Jul. 13, 2017

(30) Foreign Application Priority Data

Jan. 13, 2016 (KR) ........................ 10-2016-0004135

(51) Int. Cl.
| | | |
|---|---|---|
| *C08G 18/02* | (2006.01) | |
| *G03F 7/11* | (2006.01) | |
| *H01L 21/3213* | (2006.01) | |
| *H01L 21/311* | (2006.01) | |
| *H01L 21/027* | (2006.01) | |
| *H01L 49/02* | (2006.01) | |
| *C09D 175/00* | (2006.01) | |
| *G03F 7/004* | (2006.01) | |
| *G03F 7/09* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *H01L 21/306* | (2006.01) | |
| *H01L 21/308* | (2006.01) | |

(52) U.S. Cl.
CPC .............. *G03F 7/11* (2013.01); *C08G 18/022* (2013.01); *C09D 175/00* (2013.01); *G03F 7/0045* (2013.01); *G03F 7/091* (2013.01); *G03F 7/162* (2013.01); *G03F 7/168* (2013.01); *G03F 7/2041* (2013.01); *G03F 7/322* (2013.01); *G03F 7/38* (2013.01); *H01L 21/0276* (2013.01); *H01L 21/3081* (2013.01); *H01L 21/3086* (2013.01); *H01L 21/30604* (2013.01); *H01L 21/31144* (2013.01); *H01L 21/32139* (2013.01); *H01L 28/00* (2013.01); *G03F 7/094* (2013.01)

(58) Field of Classification Search
CPC . G03F 7/11; G03F 7/094; G03F 7/091; C08G 18/022
USPC ...................................... 430/271.1
See application file for complete search history.

(56) References Cited

U.S. PATENT DOCUMENTS

| | | | |
|---|---|---|---|
| 7,553,905 B2 | 6/2009 | Abdallah et al. | |
| 8,329,387 B2 | 12/2012 | Yao et al. | |
| 8,426,112 B2 | 4/2013 | Nakajima et al. | |
| 8,507,192 B2 | 8/2013 | Yao et al. | |
| 9,063,424 B2 | 6/2015 | Roh et al. | |
| 2010/0092894 A1 | 4/2010 | Liu et al. | |
| 2014/0170567 A1 | 6/2014 | Sakamoto et al. | |
| 2014/0227887 A1 | 8/2014 | Kim et al. | |
| 2015/0264747 A1 | 9/2015 | Abbott | |
| 2015/0286139 A1 * | 10/2015 | Han .................... | G03F 7/40 427/385.5 |

FOREIGN PATENT DOCUMENTS

| | | |
|---|---|---|
| JP | 2006-037024 A | 2/2006 |
| KR | 2013-0039932 A | 4/2013 |
| KR | 2013-0046498 A | 5/2013 |

\* cited by examiner

*Primary Examiner* — Daborah Chacko-Davis
(74) *Attorney, Agent, or Firm* — Muir Patent Law, PLLC

(57) ABSTRACT

A method of forming a pattern is disclosed. The method includes preparing a composition that includes a solvent and a polymer including a repeating unit in which at least one isocyanurate unit having a first structure is connected to another isocyanurate unit having a second structure different from the first structure; applying the composition on a substrate to form an underlayer; forming a photoresist layer on the underlayer; etching the photoresist layer to form a photoresist pattern; and patterning the substrate using the photoresist pattern.

14 Claims, 22 Drawing Sheets

METHODS OF FORMING PATTERNS USING COMPOSITIONS FOR AN UNDERLAYER OF PHOTORESIST

CROSS-REFERENCE TO RELATED APPLICATION

This application claims priority under 35 USC § 119 to Korean Patent Application No. 10-2016-0004135, filed on Jan. 13, 2016, in the Korean Intellectual Property Office (KIPO), the content of which is incorporated by reference herein in its entirety.

BACKGROUND

1. Field

Example embodiments relate to compositions for an underlayer of photoresist and methods of forming patterns using the same. More particularly, example embodiments relate to compositions for an underlayer of photoresist including a cross-linkable polymer and methods of forming patterns using the same.

2. Description of the Related Art

A photolithography process may be utilized for a formation of various patterns included in a semiconductor device. For example, a photoresist layer may be divided into an exposed portion and a non-exposed portion by, e.g., an exposure process, and the exposed portion may be removed by a developing process to form a photoresist pattern. An object layer may be patterned using the photoresist pattern as an etching mask (which is also known as photo mask, photolithography mask, photoreticle or simply reticle) to form a desired pattern. An anti-reflective coating (ARC) layer may be formed under the photoresist layer to prevent a reflection during the exposure process.

SUMMARY

Example embodiments provide a composition for an underlayer of photoresist having an improved resolution.

Example embodiments provide a method of forming a pattern using a composition for an underlayer of photoresist having an improved resolution.

According to example embodiments, there is provided a method of forming a pattern including preparing a composition that includes a solvent and a polymer including a repeating unit in which at least one isocyanurate unit having a first structure is connected to another isocyanurate unit having a second structure different from the first structure; applying the composition on a substrate to form an underlayer; forming a photoresist layer on the underlayer; etching the photoresist layer to form a photoresist pattern; and patterning the substrate using the photoresist pattern.

According to example embodiments, there is provided a method of forming a pattern. In the method, a composition that may include a self-crosslinkable polymer including a repeating unit in which at least one isocyanurate unit having a first structure is connected to another isocyanurate unit having a second structure different from the first structure, and a solvent may be prepared. The underlayer composition may be coated on an object layer to form an underlayer. A photoresist layer may be formed on the underlayer. An exposure process may be performed on the photoresist layer such that the photoresist layer may be divided into an exposed portion and a non-exposed portion. One of the exposed portion or the non-exposed portion may be removed to form a photoresist pattern. The object layer may be patterned using the photoresist pattern.

According to example embodiments, there is provided a method of forming a pattern for a semiconductor device including preparing an underlayer composition that includes a solvent and a polymer including a repeating unit having a plurality of isocyanurate units in which at least one isocyanurate unit having a first chemical composition is connected to another isocyanurate unit having a second chemical composition different from the first chemical composition; applying the underlayer composition on a semiconductor substrate to form an underlayer; forming a photoresist layer on the underlayer; etching a portion of the photoresist layer to form a photoresist pattern; and patterning the semiconductor substrate using the photoresist pattern.

BRIEF DESCRIPTION OF THE DRAWINGS

Example embodiments will be more clearly understood from the following detailed description taken in conjunction with the accompanying drawings which represent non-limiting, example embodiments as described herein.

DESCRIPTION OF EMBODIMENTS

Figure 1:
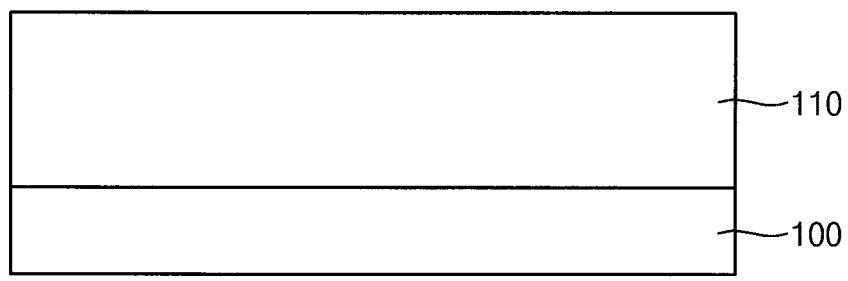
FIGS. 1 to 8 are cross-sectional views illustrating a method of forming a pattern in accordance with example embodiments.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which this disclosure belongs.

A composition for an underlayer of photoresist (hereinafter, abbreviated as an underlayer composition) in accordance with example embodiments may be utilized to form a bottom of anti-reflection coating (BARC) layer between a photoresist layer and an object layer (e.g., a target layer).

In some example embodiments, the BARC layer formed from the underlayer composition may be utilized in a photo-lithography process in which a light source having a wavelength less than about 200 nm may be used. In some embodiments, the underlayer composition may be utilized in a photo-lithography process using an ArF light source or an ArF immersion light source.

In example embodiments, the underlayer composition may include a self-crosslinkable polymer and a solvent. In some embodiments, the underlayer composition may further include an acid generator.

The self-crosslinkable polymer may include a repeating unit that may contain units capable of inducing a self-crosslinking reaction by a heat or a thermal energy. The repeating unit may include a plurality of isocyanurate units connected to each other.

In some embodiments, the plurality of isocyanurate units may include at least two different types of isocyanurate units. For example, a structure and/or chemical composition of at least one isocyanurate unit may be different from a structure and/or chemical composition of another isocyanurate unit of the plurality of isocyanurate units. In some embodiments, for example, at least one isocyanurate unit may include a $C_1$-$C_{10}$ chain-shaped hydrocarbon group and at least another isocyanurate unit of the plurality of isocyanurate units may include a $C_1$-$C_{10}$ ring-shaped hydrocarbon group. In some embodiments, for example, at least one isocyanurate unit may include a $C_1$-$C_{10}$ chain-shaped or ring-shaped saturated hydrocarbon group and at least another isocyanurate unit of the plurality of isocyanurate units may include a $C_1$-$C_{10}$ chain-shaped or ring-shaped unsaturated hydrocarbon group. In some embodiments, for example, at least one isocyanurate unit may include a $C_1$-$C_{10}$ chain-shaped or ring-shaped hydrocarbon group where the hydrocarbon group is unsubstituted and at least another isocyanurate unit of the plurality of isocyanurate units may include a $C_1$-$C_{10}$ chain-shaped or ring-shaped hydrocarbon group where the hydrocarbon group may include at least one hetero atom (e.g., oxygen (O), nitrogen (N) or sulfur (S)).

The isocyanurate unit may include a self-crosslinking side chain moiety. In some example embodiments, the isocyanurate units included in one repeating unit may include different self-crosslinking side chain moieties from each other. For example, a structure and/or chemical composition of a self-crosslinking side chain moiety of at least one isocyanurate unit may be different from a structure and/or chemical composition of a self-crosslinking side chain moiety of another isocyanurate unit included in the repeating unit. In some embodiments, for example, a self-crosslinking side chain moiety of at least one isocyanurate unit may include a $C_1$-$C_{12}$ chain-shaped hydrocarbon group and a self-crosslinking side chain moiety of at least another isocyanurate unit included in the repeating unit may include a $C_1$-$C_{12}$ ring-shaped hydrocarbon group. In some embodiments, for example, a self-crosslinking side chain moiety of at least one isocyanurate unit may include a $C_1$-$C_{12}$ chain-shaped or ring-shaped saturated hydrocarbon group and a self-crosslinking side chain moiety of at least another isocyanurate unit included in the repeating unit may include a $C_1$-$C_{12}$ chain-shaped or ring-shaped unsaturated hydrocarbon group. In some embodiments, for example, a self-crosslinking side chain moiety of at least one isocyanurate unit may include a $C_1$-$C_{12}$ chain-shaped or ring-shaped hydrocarbon group where the hydrocarbon group is unsubstituted and a self-crosslinking side chain moiety of at least another isocyanurate unit included in the repeating unit may include a $C_1$-$C_{12}$ chain-shaped or ring-shaped hydrocarbon group where the hydrocarbon group may include at least one hetero atom.

In some embodiments, the repeating unit may be represented by the following Chemical Formula 1.

Chemical Formula 1

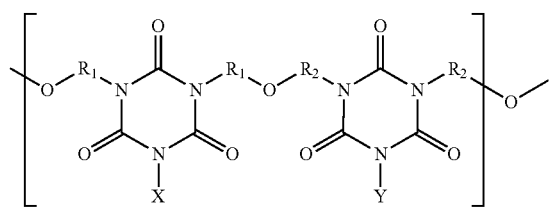

In the Chemical Formula 1, $R_1$ and $R_2$ may each independently represent a $C_1$-$C_{10}$ chain-shaped or ring-shaped hydrocarbon group. The hydrocarbon group may be saturated or may include at least one unsaturated bond. The hydrocarbon group may include alkylene, alkenylene or alkynylene that may be unsubstituted or may include at least one hetero atom (e.g., oxygen (O), nitrogen (N) or sulfur (S)).

In the Chemical Formula 1 above, X and Y may each represent the self-crosslinking side chain moiety. X and Y may each independently represent a $C_1$-$C_{12}$ chain-shaped or ring-shaped hydrocarbon group. In some embodiments, at least one of X or Y may be the $C_1$-$C_{12}$ chain-shaped or ring-shaped hydrocarbon group including a hetero atom (e.g., oxygen (O), nitrogen (N) or sulfur (S)). In example embodiments, X and Y are different from each other.

In some embodiments, at least one of X or Y may include an ether group. In some embodiments, at least one of X or Y may include another isocyanurate unit.

For example, the repeating unit may be represented by the following Chemical Formulae 1-1 to 1-4. In some embodiments, the repeating unit may include at least one structure represented by the following Chemical Formulae 1-1 to 1-4.

Chemical Formula 1-1

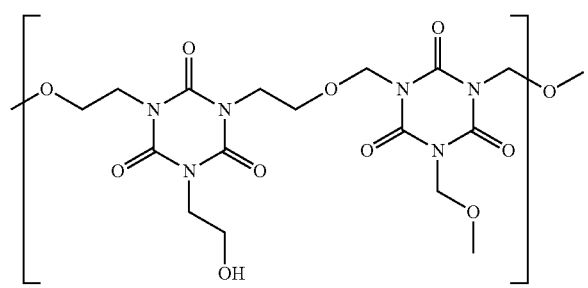

Chemical Formula 1-2

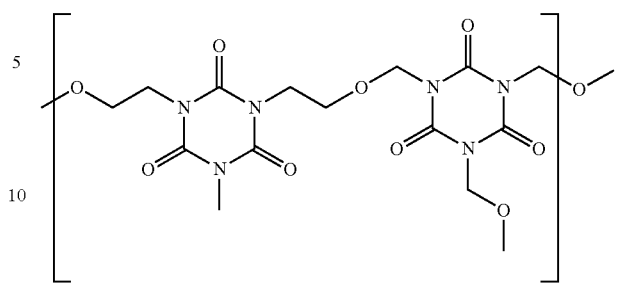

Chemical Formula 1-3

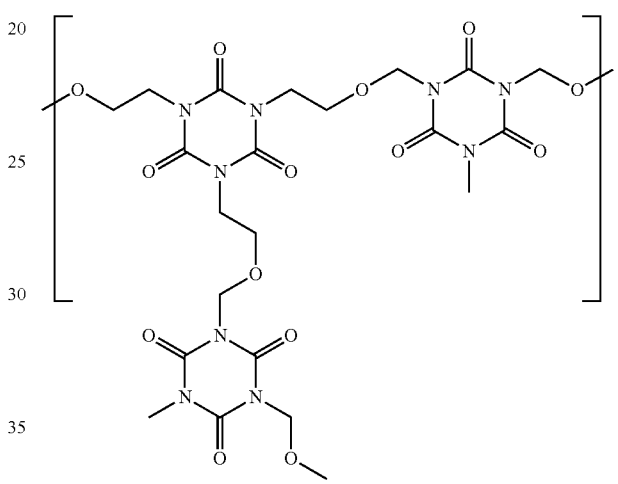

Chemical Formula 1-4

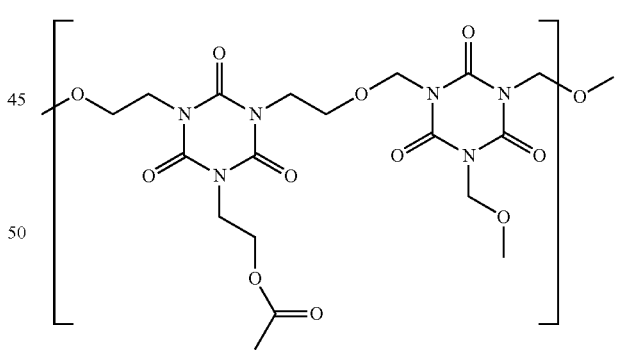

In the Chemical Formula 1 above, two isocyanurate units are included in one repeating unit. However, the repeating unit may include at least three isocyanurate units. In this case, at least two isocyanurate units of the isocyanurate units in the one repeating unit may be different, e.g., in structure and/or in chemical composition, from each other.

For example, the repeating unit may be represented by the following Chemical Formula 2.

Chemical Formula 2

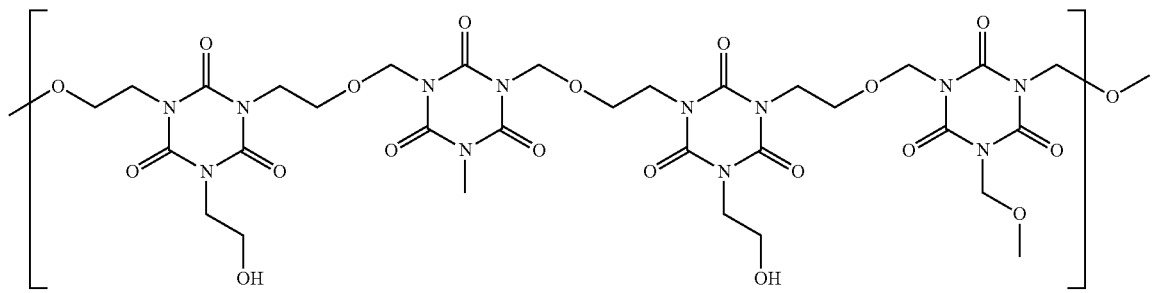

In example embodiments, a monomer-type or oligomer-type cross-linking agent may be excluded or omitted from the underlayer composition.

A self-crosslinking reaction may be induced by a thermal treatment between the self-crosslinking side chain moieties combined to the isocyanurate units. For example, a dehydrating condensation may be induced by heat between the different self-crosslinking side chain moieties included in the neighboring different repeating units. Thus, a cross-linking reaction for forming the underlayer may be induced even without using the cross-linking agent.

In some embodiments, the underlayer composition may further include the acid generator. The dehydrating condensation may be facilitated by an acid ($H^+$) generated from the acid generator.

The acid generator may include a thermal acid generator or a photo-acid generator. Examples of the acid generator may include a triflate-based compound, a sulfonate-based compound, an onium salt, an aromatic diazonium salt, a sulfonium salt, an iodonium salt, nitrobenzyl ester, disulfone, diazo-disulfone, an ammonium salt. These above-described compounds may be used alone or in a combination thereof.

In some embodiments, the acid generator may be included in an amount from about 0.01 weight percent (wt %) to about 0.1 wt %, based on a total weight of the underlayer composition. If the amount of the acid generator exceeds about 0.1 wt %, an outgassing from the acid generator may be caused during, e.g., a baking process.

In some embodiments, the solvent may include an organic solvent having a good solubility for a polymer material, and a good coatability (e.g., uniform coating characteristics) for a formation of the underlayer. Examples of the solvent may include cyclohexanone, cyclopentanone, tetrahydrofuran (THF), dimethylformamide, propylene glycol monomethyl ether acetate (PGMEA), propylene glycol monomethyl ether (PGME), butyrolactone, ethyl lactate, 2-hydroxyisobutyric acid methyl ester, methyl ethyl ketone, benzene or toluene. These may be used alone or in a combination thereof.

In some embodiments, the underlayer composition may consist essentially of the self-crosslinkable polymer and the solvent. The term "consist essentially" of a compound or compounds used herein may represent a compound or compounds without including any substantial amount of other compounds. In this case, the underlayer composition may include the self-crosslinkable polymer in a range from about 0.5 wt % to about 2 wt %, and the solvent in a range from about 98 wt % to about 99.5 wt %, based on the total weight of the underlayer composition. For example, the underlayer composition may consist essentially of the self-crosslinkable polymer and the solvent where a ratio of the self-crosslinkable polymer wt % to the solvent wt % may be a value ranging from about 0.005 to about 0.02, based on the total weight of the underlayer composition.

In some embodiments, the underlayer composition may consist essentially of the self-crosslinkable polymer, the acid generator and the solvent. In this case, the underlayer composition may include the self-crosslinkable polymer in a range from about 0.2 wt % to about 1.9 wt %, the acid generator in a range from about 0.01 wt % to about 0.1 wt %, and the solvent in a range from about 98 wt % to about 99.7 wt %, based on the total weight of the underlayer composition. For example, the underlayer composition may consist essentially of the self-crosslinkable polymer, the acid generator and the solvent where a ratio of the self-crosslinkable polymer wt % to the acid generator wt % may be a value ranging from about 19 to about 20, a ratio of the self-crosslinkable polymer wt % to the solvent wt % may be a value ranging from about 0.002 to about 0.02, and a ratio of the acid generator wt % to the solvent wt % may be a value ranging from about 0.0001 to about 0.001, based on the total weight of the underlayer composition.

In some embodiments, the underlayer composition may further include an anti-reflection coating (ARC) resin. The ARC resin may include an organic resin for forming a conventional anti-reflection layer in a photo-lithography process. In an embodiment, the ARC resin may include an isocyanurate unit.

In some embodiments, the underlayer composition may further include an additive for improving an adhesive property such as a surfactant, a wetting agent, etc.

As described above, the underlayer composition may include the self-crosslinkable polymer that may be thermally cross-linked through the self-crosslinking side chain moieties combined to the isocyanurate units. Thus, the cross-linking agent may be omitted in the underlayer composition so that process defects and apparatus contamination caused by a thermal reaction of the cross-linking agent may be avoided.

In some example embodiments, because the underlayer formed from the underlayer composition may include a plurality of isocyanurate units, the underlayer may have a high refractive index greater than about 1.9. Thus, while performing an exposure process utilizing, e.g., the ArF light source having a wavelength of about 193 nm, a reflected light may be effectively absorbed or scattered.

FIGS. 1 to 8 are cross-sectional views illustrating a method of forming a pattern in accordance with example embodiments;

For example, FIGS. 1 to 8 illustrate a method of forming a pattern utilizing the above-mentioned underlayer composition.

Referring to FIG. 1, an object layer 110 may be formed on a substrate 100. The substrate 100 may include a semiconductor substrate or a semiconductor-on-insulator substrate. For example, the substrate 100 may include a silicon substrate, a germanium substrate, a silicon-germanium substrate, a silicon-on-insulator (SOI) substrate or a germanium-on-insulator (GOI) substrate, but the substrate is not limited thereto. In example embodiments, the substrate 100 may include a group III-V compound such as GaP, GaAs or GaSb.

An image may be transferred from a photoresist pattern to the object layer 110 so that the object layer 110 may be converted to a desired (or predetermined) pattern. In some embodiments, the object layer 110 may be formed on an insulation material, e.g., silicon oxide, silicon nitride and/or silicon oxynitride. In some embodiments, the object layer 110 may be formed of a conductive material, e.g., a metal, a metal nitride, a metal silicide, a metal silicide nitride, etc. In some embodiments, the object layer 110 may be formed of a semiconductor material, e.g., polysilicon.

Figure 2:
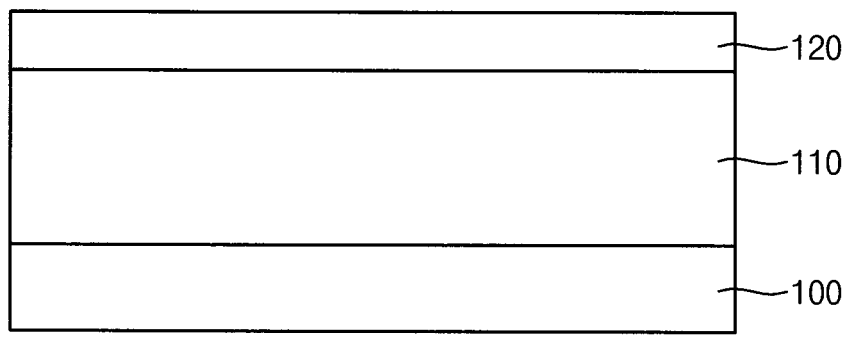

Referring to FIG. 2, an underlayer 120 may be formed on the object layer 110.

In example embodiments, the underlayer composition may be coated on the object layer 110 by, e.g., a spin coating process, and a baking process may be performed to form the underlayer 120.

As described above, the underlayer composition may include a self-crosslinkable polymer and a solvent. In example embodiments, the underlayer composition may not include, e.g., a monomer-type or oligomer-type cross-linking agent.

The self-crosslinkable polymer may include a repeating unit that may contain a plurality of isocyanurate units connected to each other. In some embodiments, the plurality of isocyanurate units may include at least two different types of (e.g., different in structure and/or chemical composition) isocyanurate units. The isocyanurate unit may include a self-crosslinking side chain moiety.

In some embodiments, the repeating unit of the self-crosslinkable polymer may include a structure represented by the Chemical Formula 1 above. For example, the repeating unit may include at least one structure represented by the Chemical Formulae 1-1 to 1-4 above.

In some embodiments, the repeating unit may include at least three isocyanurate units. For example, the repeating unit may include a structure represented by the Chemical Formula 2 above.

In some embodiments, the underlayer composition may further include an acid generator such as a thermal acid generator.

A cross-linking reaction may occur by the baking process between the self-crosslinking side chain moieties included in the different isocyanurate units.

For example, if the repeating unit includes the structure of the Chemical Formula 1-1, a dehydration or de-methanol (a removal of methanol) reaction may occur such that the self-crosslinking side chain moieties included in the different repeating units may be connected to each other to form an ether bond. A plurality of the ether bonds may be created successively, and the repeating units may be cross-linked to each other to form the underlayer 120.

For example, if the repeating unit includes the structure of the Chemical Formula 1-4, a de-carboyxlation reaction may occur so that a cross-linking between the repeating units may be induced.

In some embodiments, if the underlayer composition further includes the acid generator, an acid created from the acid generator may serve as a catalyst of the cross-linking reaction such as the dehydration, the de-methanol and/or the de-carboxylation reactions.

In some embodiments, the baking process may be performed at a temperature in a range from about 150° C. to about 250° C. If the temperature of the baking process is less than about 150° C., the cross-linking reaction between the repeating units may not be sufficiently induced. If the temperature of the baking process exceeds about 250° C., a back-bone structure of the self-crosslinkable polymer may be damaged.

For example, the baking process may be performed by loading the substrate 100 on a hot plate after coating the underlayer composition.

In example embodiments, the underlayer 120 may have a refractive index greater than about 1.9. In some embodiments, the refractive index of the underlayer 120 may be greater than about 1.92. In an embodiment, the refractive index of the underlayer 120 may be in a range of about 1.94 to about 2.

The underlayer 120 may include thermally cross-linked isocyanurate units, and thus have a high refractive index in the above-mentioned range. Thus, an anti-reflective property of the underlayer 120 may be improved in a subsequent exposure process (see FIG. 4), and a thickness of the underlayer 120 may be reduced relatively to a conventional BARC layer. Therefore, an efficiency of a subsequent etching process (see FIG. 6) may be also improved.

Figure 3:
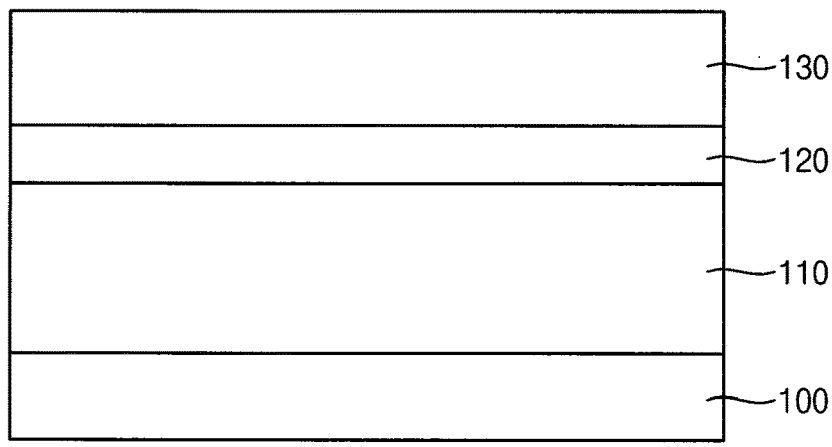

Referring to FIG. 3, a photoresist layer 130 may be formed on the underlayer 120.

A negative-tone or positive-tone may be coated on the underlayer 120 by, e.g., a spin coating process, a dip coating process, a spray coating process, or the like. In some embodiments, the photoresist composition may be coated to form a preliminary photoresist layer, and the preliminary photoresist layer may be cured by a soft-baking process to form the photoresist layer 130.

The photoresist composition may include a photosensitive polymer having, e.g., a novolac-based, an acrylate-based or polyhydroxystyrene-based back-bone structure. The photoresist composition may further include an additive such as a photo-acid generator, a sensitizer, a surfactant, etc.

Hereinafter, the photoresist layer 130 will be considered as being formed from the positive-tone photoresist composition.

Figure 4:
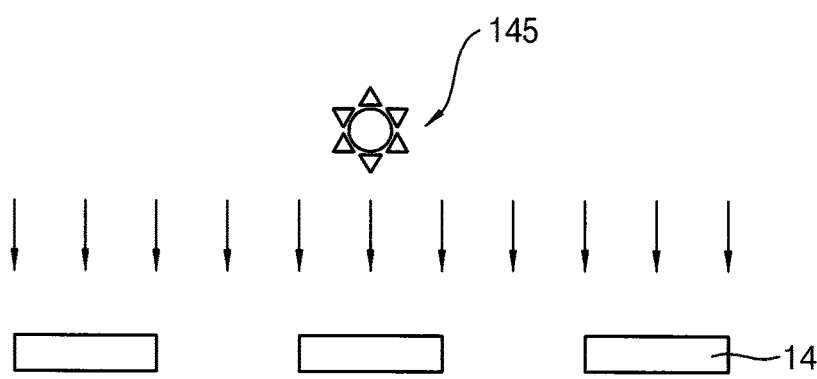
Figure 4:
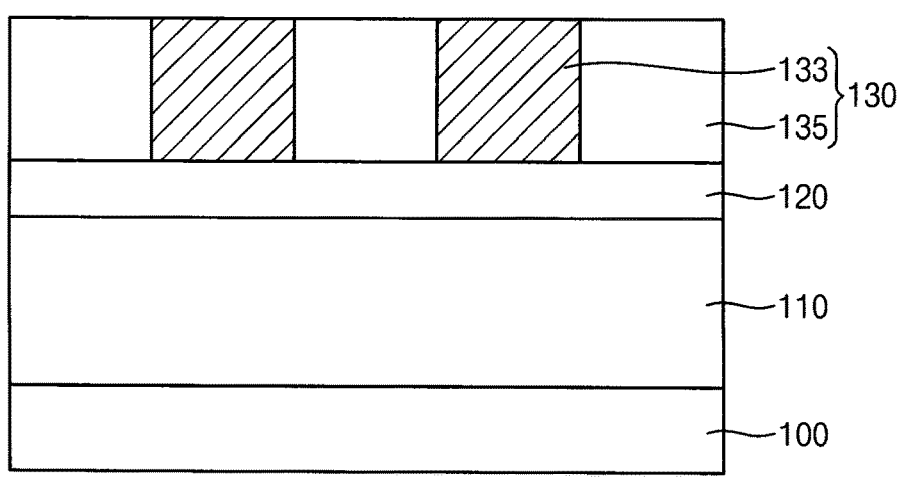

Referring to FIG. 4, an exposure process may be performed on the photoresist layer 130 such that the photoresist layer 130 may be divided into an exposed portion 133 and a non-exposed portion 135.

In example embodiments, as illustrated in FIG. 4, an exposure mask 140 may be placed over the photoresist layer 130. A light may be generated from a light source 145 toward the exposure mask 140, and the light through a transmissive portion of the exposure mask 140 may be irradiated on the photoresist layer 130. The light source 145 may include a source of, e.g., ArF, KrF, an electron beam, I-line, extreme ultraviolet (EUV), etc. In example embodiments, an ArF light source or an ArF immersion light source may be utilized as the light source 145.

As a wavelength of the light (e.g., about 193 nm from the ArF light source) becomes shorter, a resolution of the exposure process may be improved. However, a reflection of light from the object layer 110 may become severe, and defects such as undercut, notching of a photoresist pattern may be caused.

However, the underlayer 120 may have the high refractive index in the above-mentioned range, and a reflected light may be effectively absorbed or scattered by the underlayer 120.

A portion of the photoresist layer 130 on which the light through the exposure mask 140 may be irradiated may be transformed into the exposed portion 133. A remaining portion of the photoresist layer 130 except for the exposed portion 133 may be defined as the non-exposed portion 135.

For example, an acid may be generated from the photo-acid generator at the exposed portion 133, and a protecting group included in the photosensitive polymer may be removed by a de-protecting reaction. A polar group and/or a hydrophilic group may be created at a site from which the protecting group may be removed at the exposed portion 133, and a solubility of the exposed portion 133 with respect to a developer solution may be increased.

In some embodiments, a post exposure baking (PEB) process may be further performed after the exposure process. The acid generated during the exposure process may be uniformly distributed throughout the exposed portion 133 by the PEB process.

Figure 5:
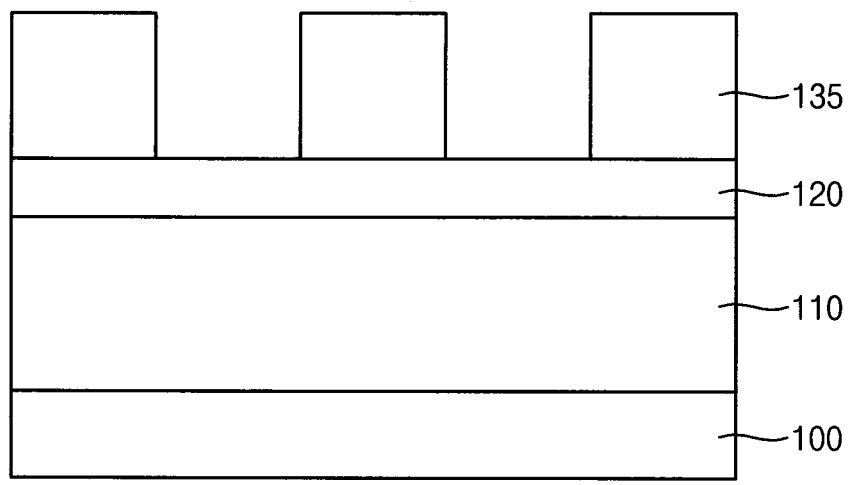

Referring to FIG. 5, the exposed portion 133 of the photoresist layer 130 may be selectively removed by a developing process. Accordingly, a photoresist pattern may be defined by the non-exposed portion 135 remaining on the underlayer 120.

An alcohol-based solution, or a hydroxide-based solution including, e.g., tetra methyl ammonium hydroxide (TMAH) may be used as a developer solution in the developing process. As described above, the exposed portion 133 may become more polar or hydrophilic than the non-exposed portion 135, and may become more soluble to the developer solution. Thus, the exposed portion 133 may be only removed by the developer solution such as TMAH.

In some embodiments, the photoresist layer 130 may be formed from the negative-tone photoresist composition, and a curing reaction may occur at the exposed portion 133 by the exposure process. In this case, the non-exposed portion 135 may be selectively removed by the developing process, and a photoresist pattern may be defined by the remaining exposed portion 133.

In some embodiments, a hard-baking process may be further performed after forming the photoresist pattern.

While performing the baking processes on the photoresist layer 130 or the photoresist pattern, an outgassing due to a thermal decomposition of the cross-linking agent may be avoided because the underlayer 120 may not include the cross-linking agent. Thus, defects of the photoresist pattern, and a contamination of a process apparatus by the cross-linking agent may be prevented.

Figure 6:
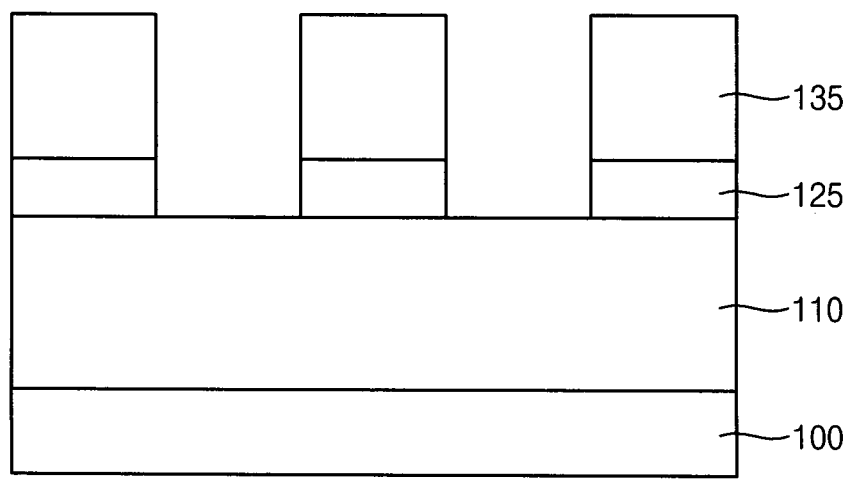

Referring to FIG. 6, the underlayer 120 may be partially removed using the photoresist pattern defined by the non-exposed portion 135 as an etching mask to form an underlayer pattern 125.

As described above, the thickness of the underlayer 120 may be reduced relatively to the conventional BARC layer, and thus a process cost or a process time for forming the underlayer pattern 125 may be also reduced.

In some embodiments, the underlayer 120 may be partially removed by a dry etching process using an inert gas such as argon and/or an alkyl fluoride.

Figure 7:
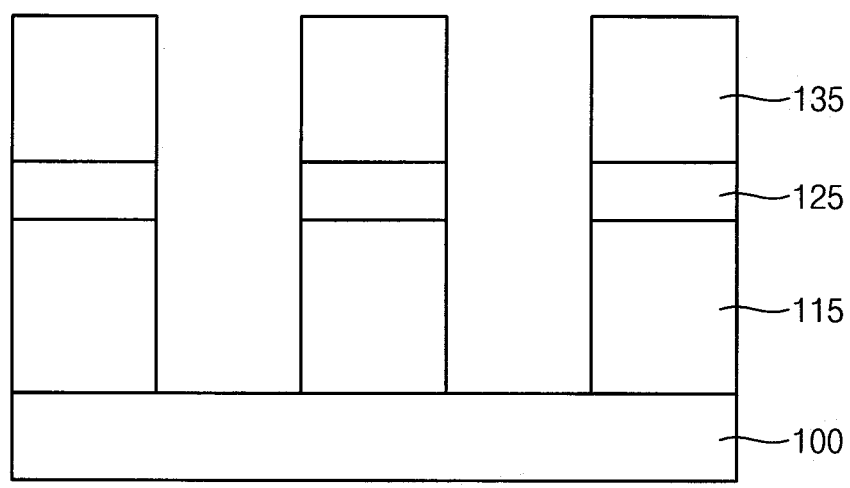

Referring to FIG. 7, the object layer 110 may be etched using the non-exposed portion 135 and the underlayer pattern 125 substantially as an etching mask. Accordingly, a target pattern 115 may be formed from the object layer 110.

The etching process may include a dry etching process and/or a wet etching process properly selected in consideration of an etching selectivity between the object layer 110 and the photoresist pattern (the non-exposed portion 135).

In some embodiments, the dry etching process may include a plasma etching process. In some embodiments, a proper etchant solution including fluoric acid, phosphoric acid or a peroxide-based solution may be selected depending on a material of the object layer 110 in the wet etching process.

Figure 8:
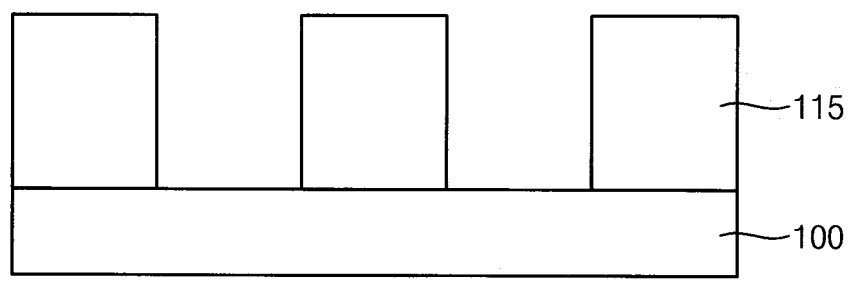

Referring to FIG. 8, the non-exposed portion 135 and the underlayer pattern 125 may be removed. For example, the exposed portion 135 and the underlayer pattern 125 may be removed by an ashing process and/or a strip process.

If the object layer 110 is formed of the conductive material, the target pattern 115 may serve as a wiring, a contact, a pad, a plug, an interconnection structure, etc., of a semiconductor device.

If the object layer 110 is formed of the insulation material, the target pattern 115 may serve as, e.g., an insulating interlayer pattern, a filling insulation pattern, or the like.

As described above, the underlayer 120 may be formed using the underlayer composition according to example embodiments as a high refractive index thin layer. Thus, a pattern defect caused by the reflected light during a photo-lithography process using, e.g., the ArF light source may be efficiently prevented or reduced.

FIGS. 9 to 16 are cross-sectional views illustrating a method of forming a pattern in accordance with example embodiments.

Figure 9:
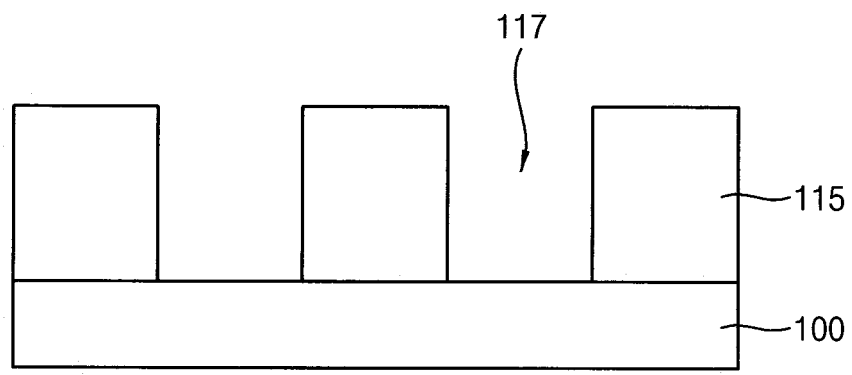
FIGS. 9 to 16 are cross-sectional views illustrating a method of forming a pattern in accordance with example embodiments.

Referring to FIG. 9, as illustrated with reference to FIGS. 1 to 8, a target pattern 115 may be formed on a substrate 100.

In example embodiments, the target pattern 115 may include an insulation material such as silicon oxide. Hereinafter, the target pattern 115 may be referred to as a lower insulation pattern. A first opening 117 through which a top surface of the substrate 100 may be exposed may be formed in the lower insulation pattern 115.

Figure 10:
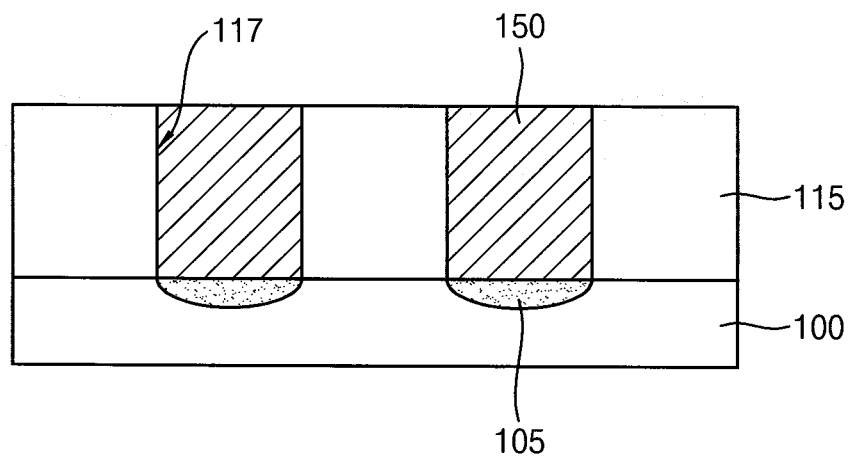

Referring to FIG. 10, an impurity region 105 may be formed at an upper portion of the substrate 100 exposed through the first opening 117 by an ion-implantation process.

A lower conductive pattern 150 electrically connected to the impurity region 105 may be formed in the first opening 117. For example, a conductive layer sufficiently filling the first opening 117 may be formed on the lower insulation pattern 115. An upper portion of the conductive layer may be planarized by a chemical mechanical polish (CMP) process until a top surface of the lower insulation pattern 115 may be exposed to form the lower conductive pattern 150 filling the first opening 117. For example, the lower conductive pattern 150 may serve as a pillar-shaped contact or plug.

The conductive layer may be formed of a metal such as copper, tungsten, aluminum, etc., a metal nitride and/or doped polysilicon by a sputtering process, an atomic layer deposition (ALD) process, a physical vapor deposition (PVD) process, a chemical Vapor Deposition (CVD) process, a plasma enhanced chemical vapor deposition (PECVD) process or a plating process.

Figure 11:
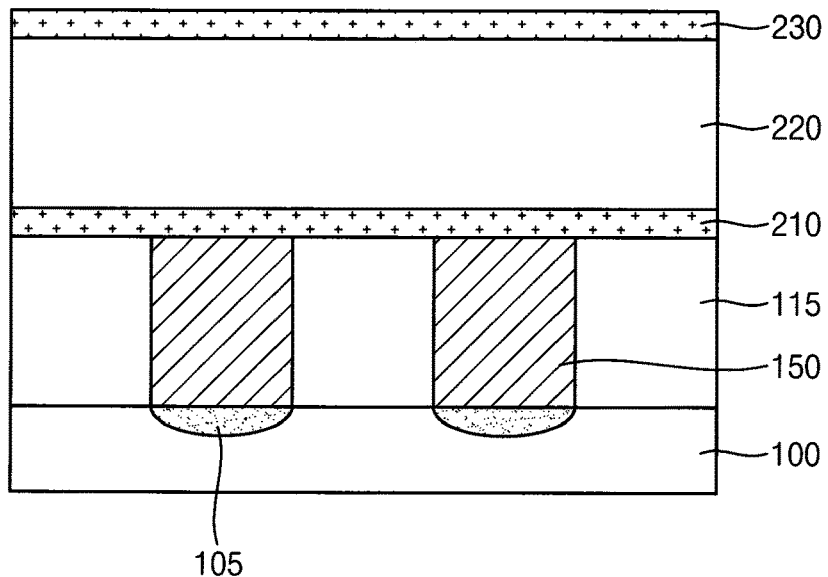

Referring to FIG. 11, a first etch-stop layer 210, an insulating interlayer 220 and a second etch-stop layer 230 may be sequentially formed on the lower insulation pattern 115 and the lower conductive pattern 150.

The first and second etch-stop layers 210 and 230 may be formed of, e.g., silicon nitride or silicon oxynitride. The insulating interlayer 220 may be formed of silicon oxide such as plasma enhanced oxide (PEOX), tetraethyl orthosilicate (TEOS), silicate glass, etc., or a low dielectric (low-k) oxide such as a siloxane-based or silsesquioxane-based compound The first etch-stop layer 210, the insulating interlayer 220 and the second etch-stop layer 230 may be formed by, e.g., a CVD process, a PECVD process, an ALD process, a spin coating process, etc.

Figure 12:
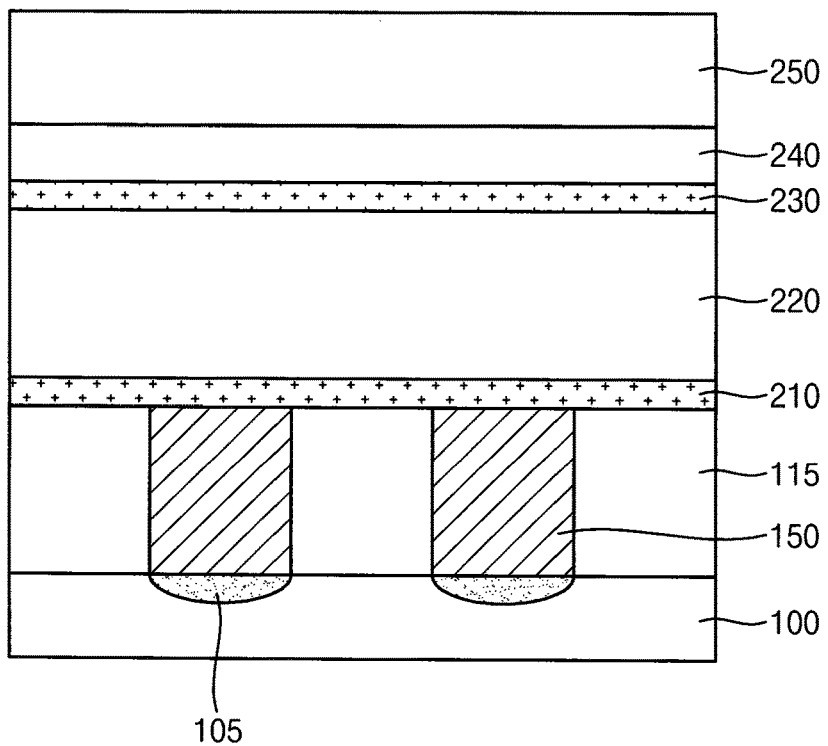

Referring to FIG. 12, an underlayer 240 and a photoresist layer 250 may be formed on the second etch-stop layer 230.

In example embodiments, the underlayer 240 and the photoresist layer 250 may be formed from materials and processes substantially the same as or similar to those of the underlayer 120 and the photoresist layer 130, respectively, illustrated with reference to FIGS. 2 and 3.

As described above, self-crosslinkable polymers including repeating units in which a plurality of isocyanurate units may be combined to each other may be thermally cured and/or cross-linked to form the underlayer 240. A refractive index of the underlayer 240 may be greater than about 1.9. For example, the refractive index of the underlayer 240 may be in a range from about 1.94 to about 2.

Figure 13:
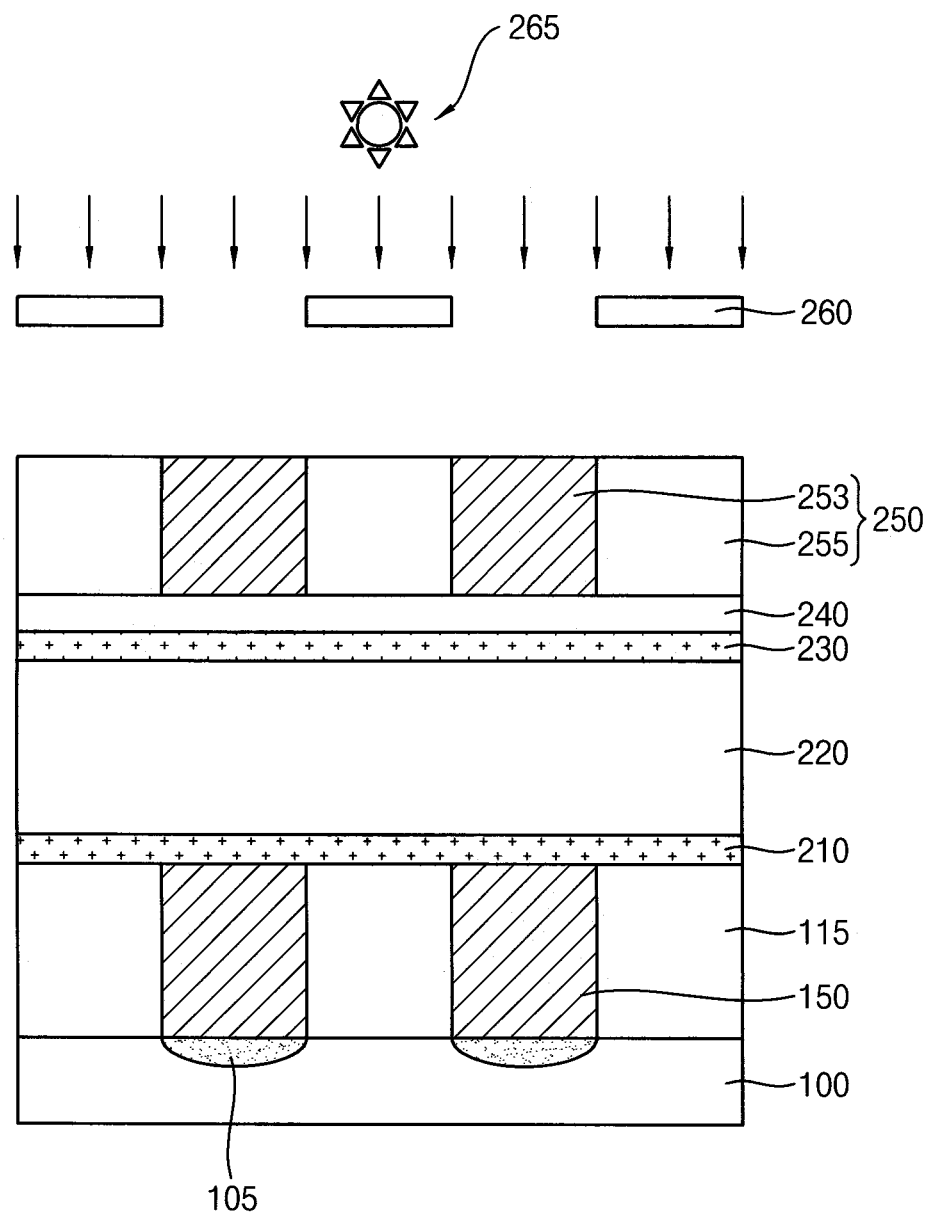

Referring to FIG. 13, a process substantially the same as or similar to that illustrated in FIG. 4 may be performed.

In example embodiments, an exposure process may be performed using a light source 265 and an exposure mask 260 such that the photoresist layer 250 may be divided into an exposed portion 253 and a non-exposed portion 255.

In some embodiments, the light source 265 may include an ArF light source or an ArF immersion light source. A reflected light from an exposure light may be efficiently absorbed or scattered by a high refractive property of the underlayer 240 so that the exposed portion 253 may be formed to have a desired shape at a desired area with an improved resolution.

Figure 14:
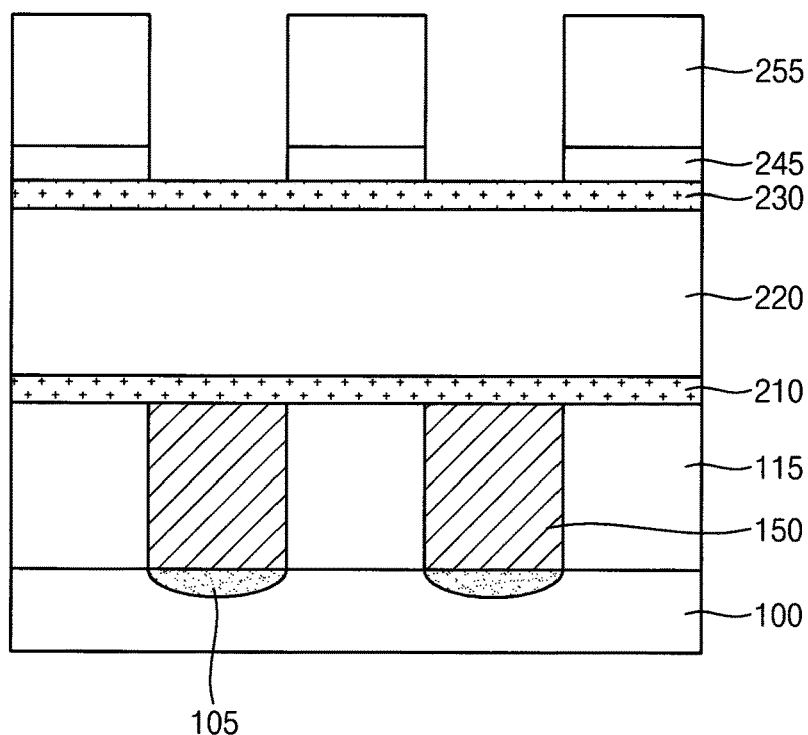

Referring to FIG. 14, processes substantially the same as or similar to those illustrated in FIGS. 5 and 6 may be performed.

For example, the exposed portion 253 may be selectively removed using a developer solution such as TMAH. The underlayer 240 may be partially removed using the remaining non-exposed portion 255 as a photoresist pattern to form an underlayer pattern 245.

Figure 15:
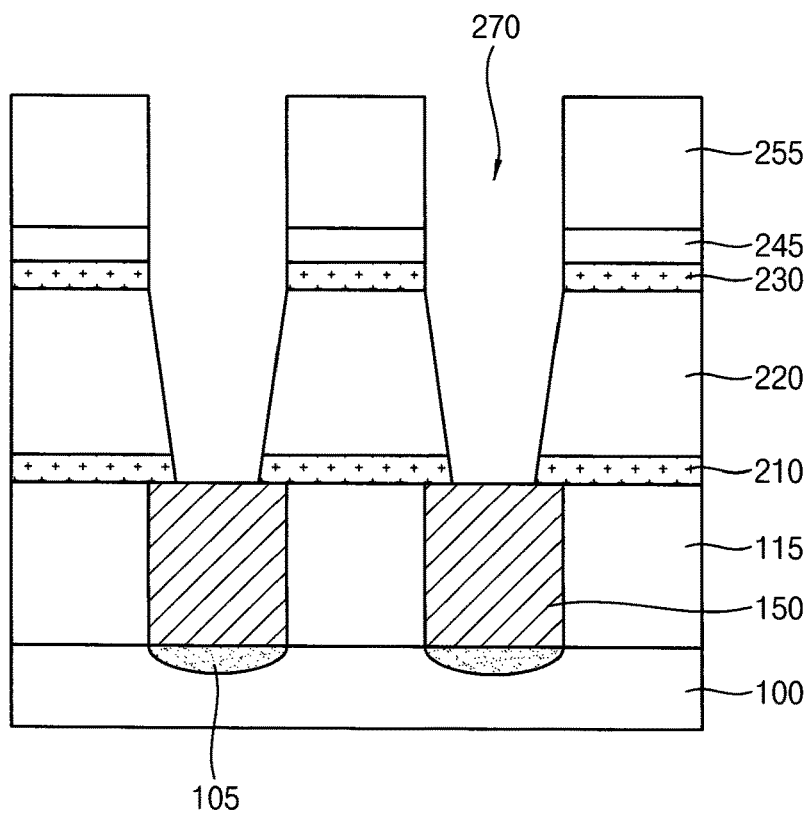

Referring to FIG. 15, the second etch-stop layer 230, the insulating interlayer 220 and the first etch-stop layer 210 may be partially and sequentially etched using the non-exposed portion 255 and the underlayer pattern 245 substantially as an etching mask to form a second opening 270. The lower conductive pattern 150 may be exposed through the second opening 270.

The second opening 270 may be formed by, e.g., a dry etching process. The second opening 270 may extend through the insulating interlayer 220 and the first etch-stop layer 210 to expose at least a portion of the lower conductive pattern 150.

In some embodiments, the second opening 270 may have a contact hole shape through which each lower conductive pattern 150 may be exposed. In some embodiments, the second opening 270 may linearly extend and expose a plurality of the lower conductive patterns 150.

The non-exposed portion 255 and the underlayer pattern 245 may be removed by, e.g., an ashing process and/or a strip process after forming the second openings 270.

Figure 16:
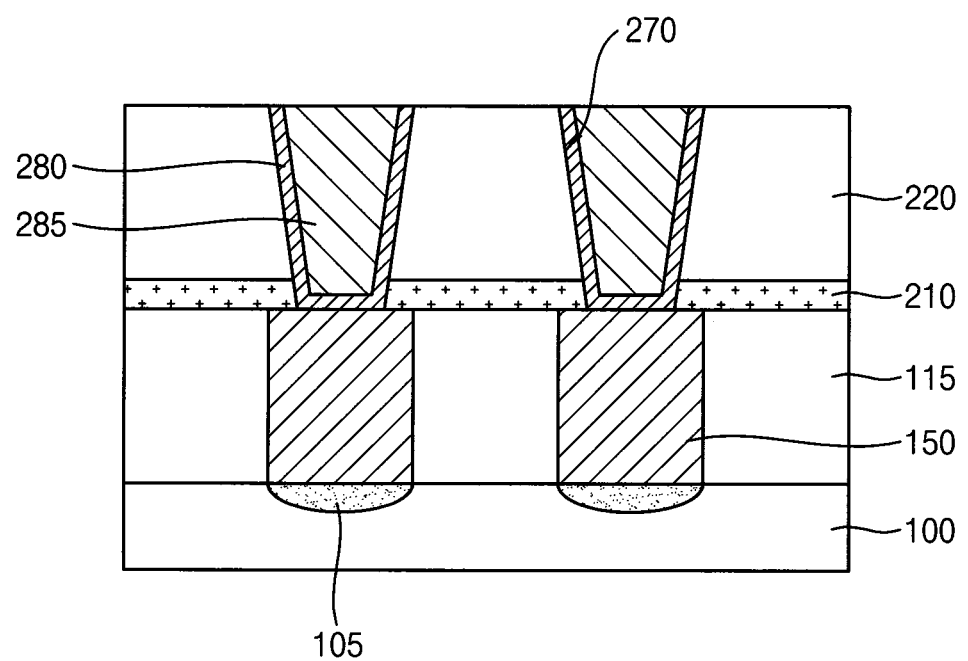

Referring to FIG. 16, an upper conductive pattern electrically connected to the lower conductive pattern 150 may be formed in the second opening 270. The upper conductive pattern may include, e.g., a barrier pattern 280 and a metal pattern 285.

In example embodiments, a barrier layer may be formed along a top surface of the insulating interlayer 220, and sidewalls and bottoms of the second openings 270. A metal layer sufficiently filling the second openings 270 may be formed on the barrier layer.

The barrier layer may be formed of a metal nitride such as titanium nitride, tantalum nitride or tungsten nitride. A diffusion of metallic ingredients in the metal layer to the insulating interlayer 220 may be blocked by the barrier layer. The barrier layer may also provide an adhesion for forming the metal layer. The barrier layer may be formed by, e.g., a sputtering process or an ALD process.

The metal layer may be formed by, e.g., an electroplating process. For example, a seed layer may be formed conformally on the barrier layer by a sputtering process using a copper target. A current may be applied in a plating solution including, e.g., copper sulfate so that the metal layer including copper may be precipitated or grown from the seed layer.

In some embodiments, the metal layer may be formed by, e.g., a sputtering process in which a metal target including copper, tungsten, aluminum, etc., may be used, or an ALD process.

In some embodiments, upper portions of the metal layer and the barrier layer may be planarized by, e.g., a CMP process until the insulating interlayer 220 may be exposed. After the planarization process, the barrier pattern 280 may be formed on the sidewall and the bottom of each second opening 270 from the barrier layer, and the metal pattern 285 filling each second opening 270 may be formed on the barrier pattern 280 from the metal layer.

In some embodiments, a capping layer covering a top surface of the upper conductive pattern may be further formed using a chemically stable metal such as molybdenum, cobalt, or the like.

In some embodiments, an insulation layer and an upper wiring may be further formed on the insulating interlayer 220 and the upper conductive pattern. In this case, the upper conductive pattern may serve as an interconnection structure electrically connecting the lower conductive pattern 150 and the upper wiring with each other.

FIGS. 17 to 32 are top plan views and cross-sectional views illustrating a method of manufacturing a semiconductor device in accordance with example embodiments.

Figure 17:
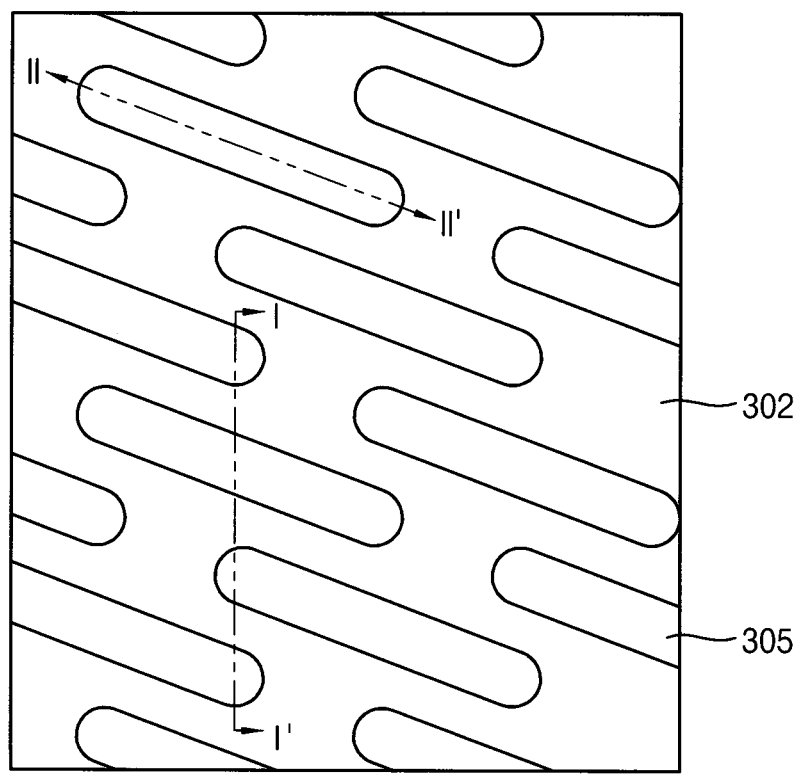
FIGS. 17 to 32 are top plan views and cross-sectional views illustrating a method of manufacturing a semiconductor device in accordance with example embodiments.
Figure 17:
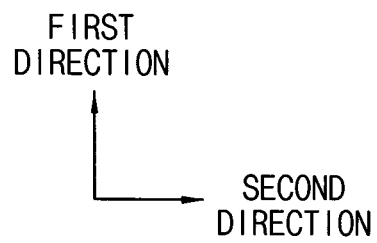
Figure 23:
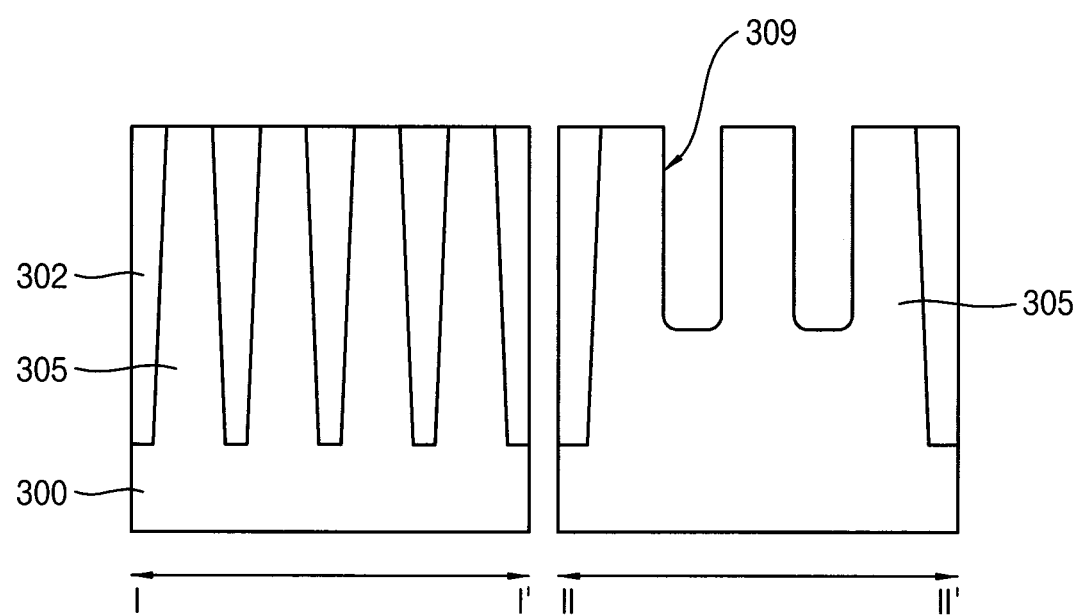
Figure 24:
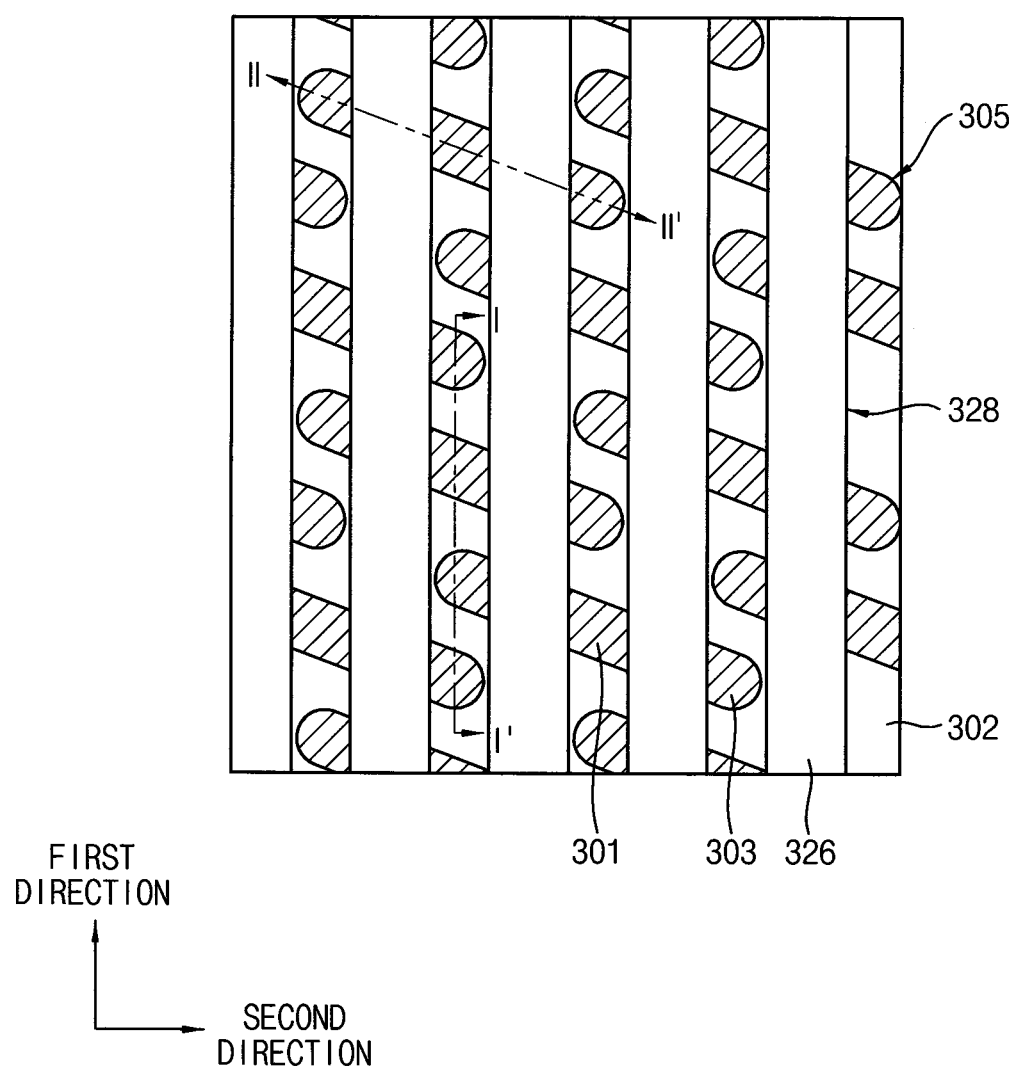
Figure 27:
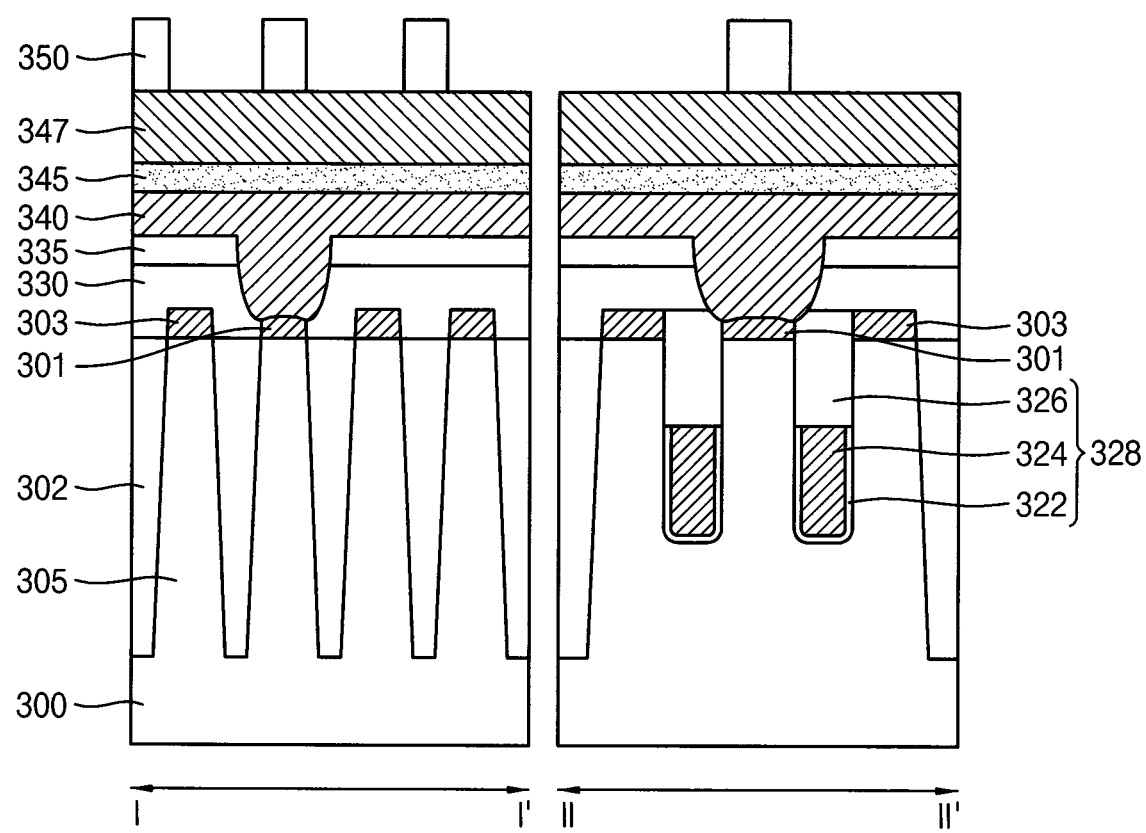
Figure 28:
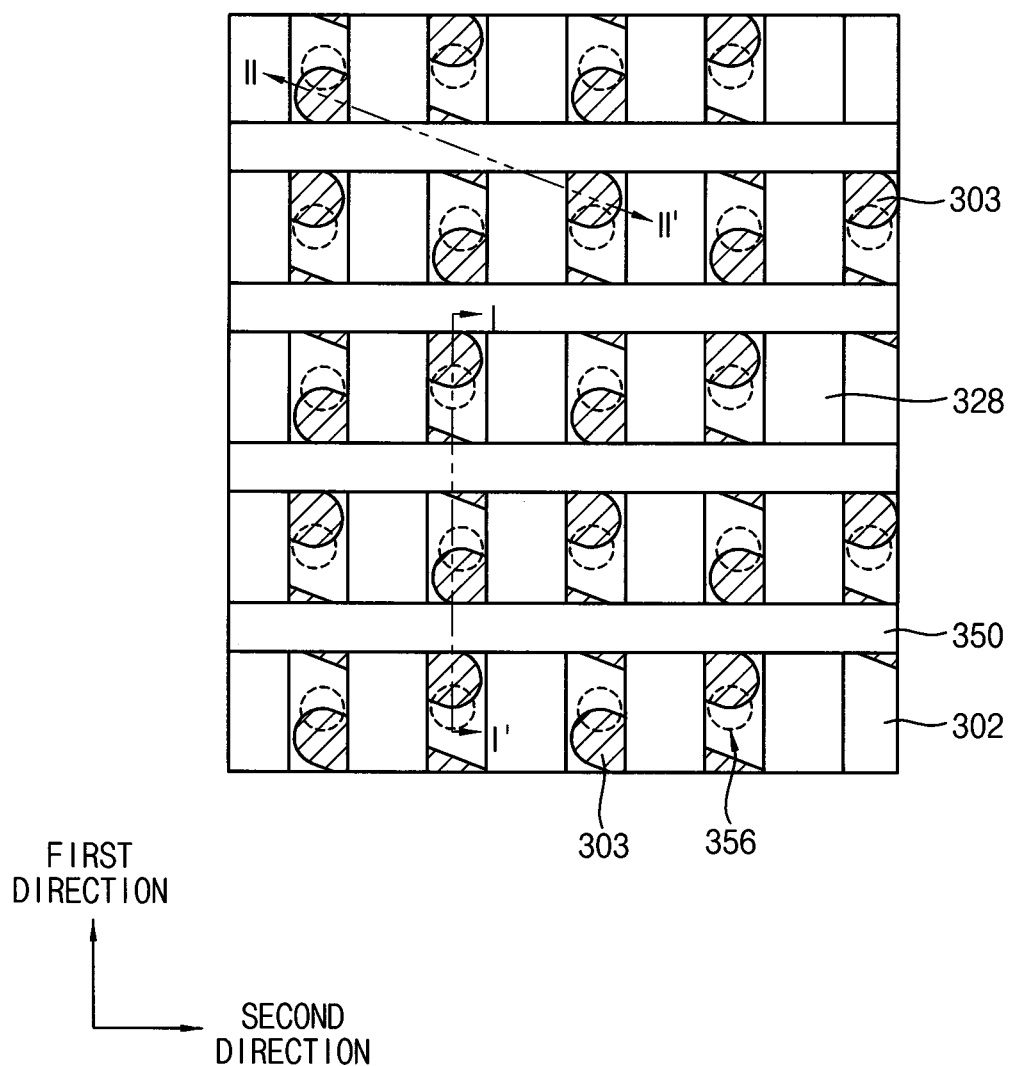

Specifically, FIGS. 17, 24 and 28 are top plan views illustrating stages of the method. Each of FIGS. 18 to 23, 25, 26, 27, and 29 to 32 includes sub-cross sectional views taken along lines I-I' and II-II' indicated in FIGS. 17, 24 and 28.

For example, FIGS. 17 to 32 illustrate a method of manufacturing a semiconductor device including a buried cell array transistor (BCAT) structure according to example embodiments. Detailed descriptions on processes and/or materials substantially the same as or similar to those illustrated with reference to FIGS. 1 to 16 are omitted herein.

Two directions substantially parallel to a top surface of a substrate and perpendicular to each other are defined as a first direction and a second direction throughout FIGS. 17 to 32.

Figure 18:
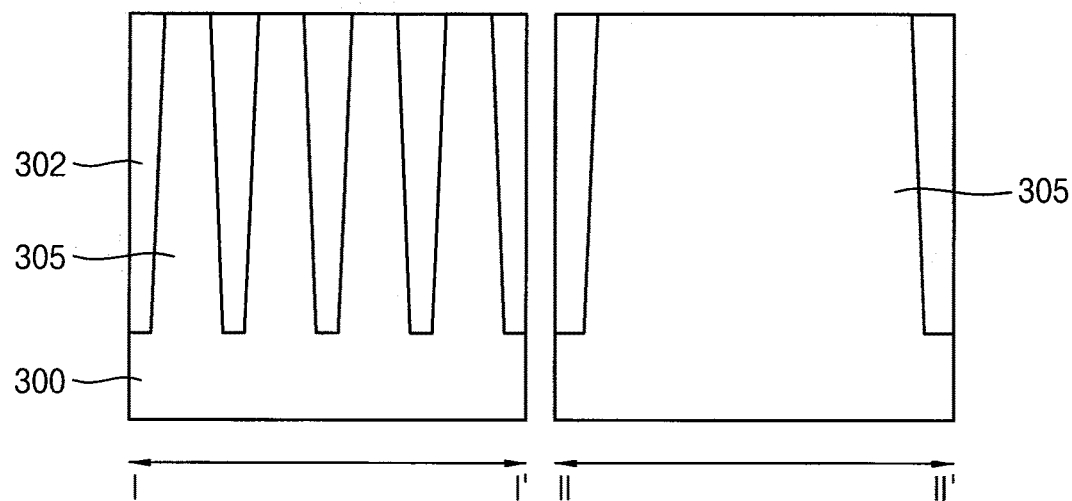

Referring to FIGS. 17 and 18, an isolation layer 302 may be formed on a substrate 300 to define active patterns 305.

The substrate 300 may include single crystalline silicon, single crystalline germanium, silicon-germanium or a group III-V compound such as GaP, GaAs, GaSb, etc. In some embodiments, the substrate 300 may be an SOI substrate or a GOI substrate.

For example, the isolation layer 302 and the active pattern 305 may be formed by a shallow trench isolation (STI) process. For example, an upper portion of the substrate 300 may be partially removed by an anisotropic etching process to form an isolation trench. An insulation layer filling the isolation trench and including, e.g., silicon oxide may be formed on the substrate 300. An upper portion of the insulation layer may be planarized by, e.g., a CMP process until a top surface of the substrate 300 may be exposed to form the isolation layer 302.

A plurality of the active patterns 305 may be formed to be spaced apart from each other by the isolation layer 302. As illustrated in FIG. 17, each active pattern 305 may extend in a diagonal direction relative to the first direction or the second direction by a predetermined angle. The plurality of the active patterns 305 may be arranged in the first and second directions.

Figure 19:
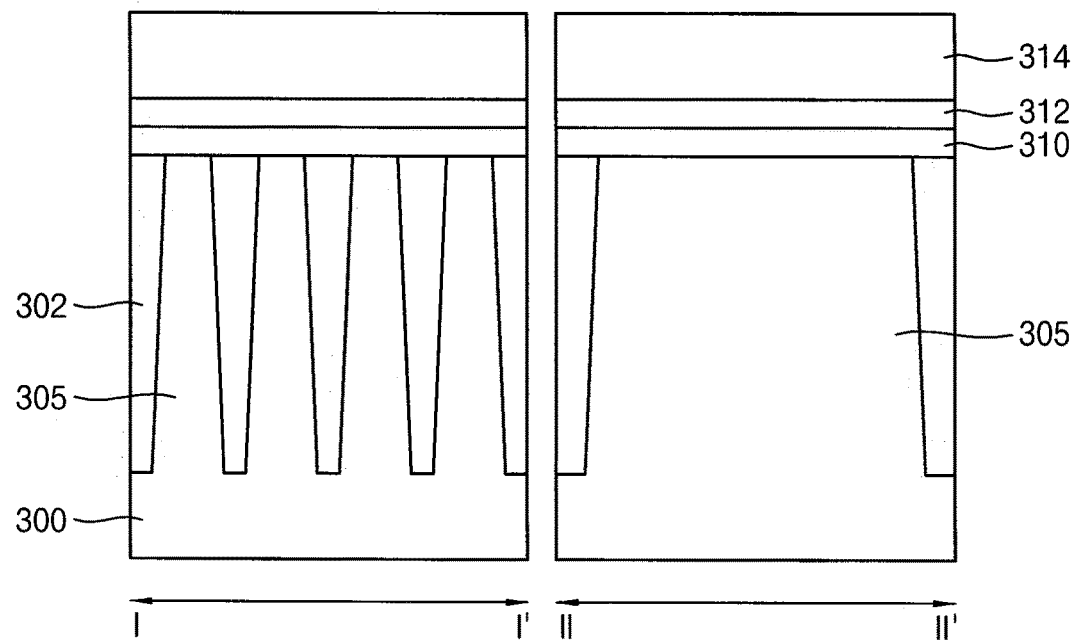

Referring to FIG. 19, an etch-stop layer 310, an underlayer 312 and a photoresist layer 314 may be formed on the isolation layer 302 and the active patterns 305.

The etch-stop layer 310 may be formed of silicon oxynitride or silicon nitride.

The underlayer 312 and the photoresist layer 314 may be formed from materials and processes substantially the same as or similar to those of the underlayer 120 and the photoresist layer 130, respectively, illustrated with reference to FIGS. 2 and 3.

As described above, self-crosslinkable polymers including repeating units in which a plurality of isocyanurate units may be combined to each other may be thermally cured and/or cross-linked to form the underlayer 312. A refractive index of the underlayer 312 may be greater than about 1.9. For example, the refractive index of the underlayer 312 may be in a range from about 1.94 to about 2.

Figure 20:
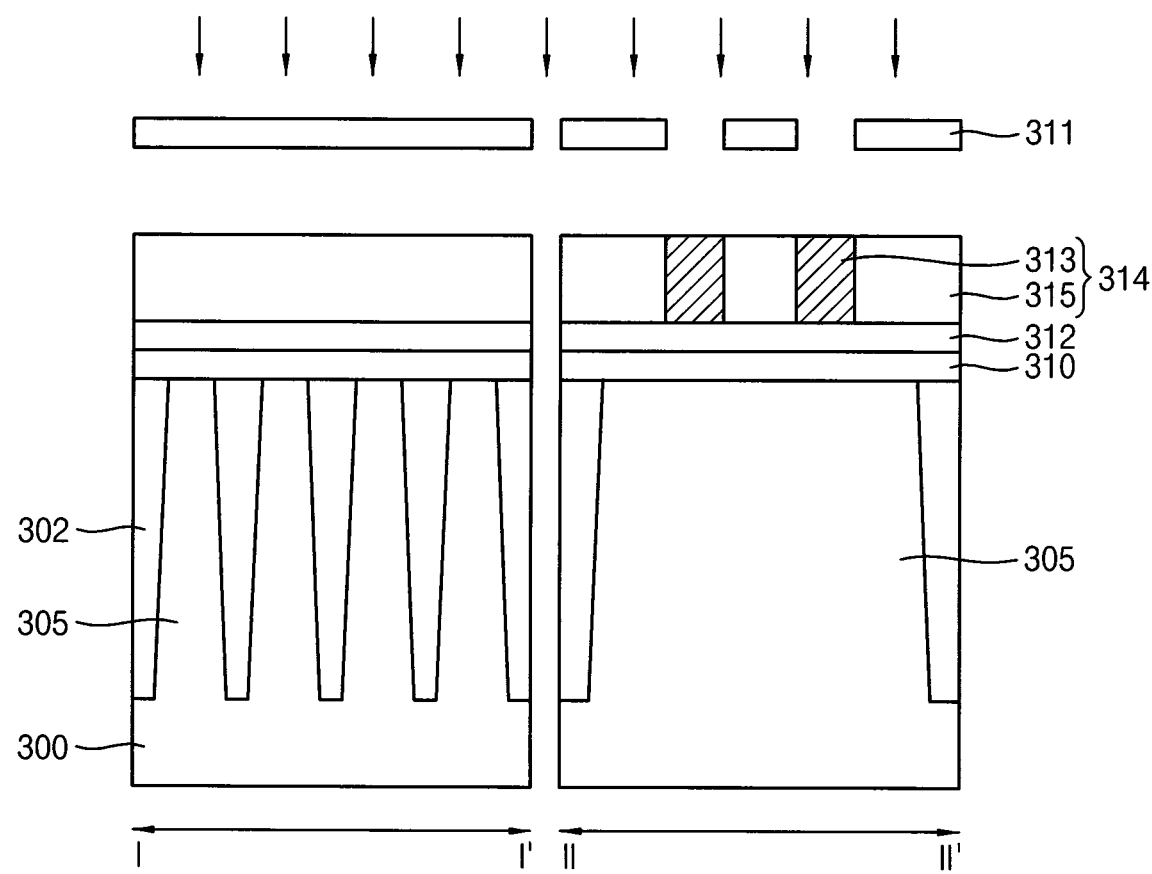

Referring to FIG. 20, a process substantially the same as or similar to that illustrated in FIG. 4 may be performed.

In example embodiments, an exposure light may be irradiated through an exposure mask 311 such that the photoresist layer 314 may be divided into an exposed portion 313 and a non-exposed portion 315.

In some embodiments, an ArF light source or an ArF immersion light source may be used as a light source of the exposure process. A reflected light from the exposure light may be efficiently absorbed or scattered by a high refractive property of the underlayer 312 so that the exposed portion 313 may be formed to have a desired shape at a desired area with an improved resolution.

Figure 21:
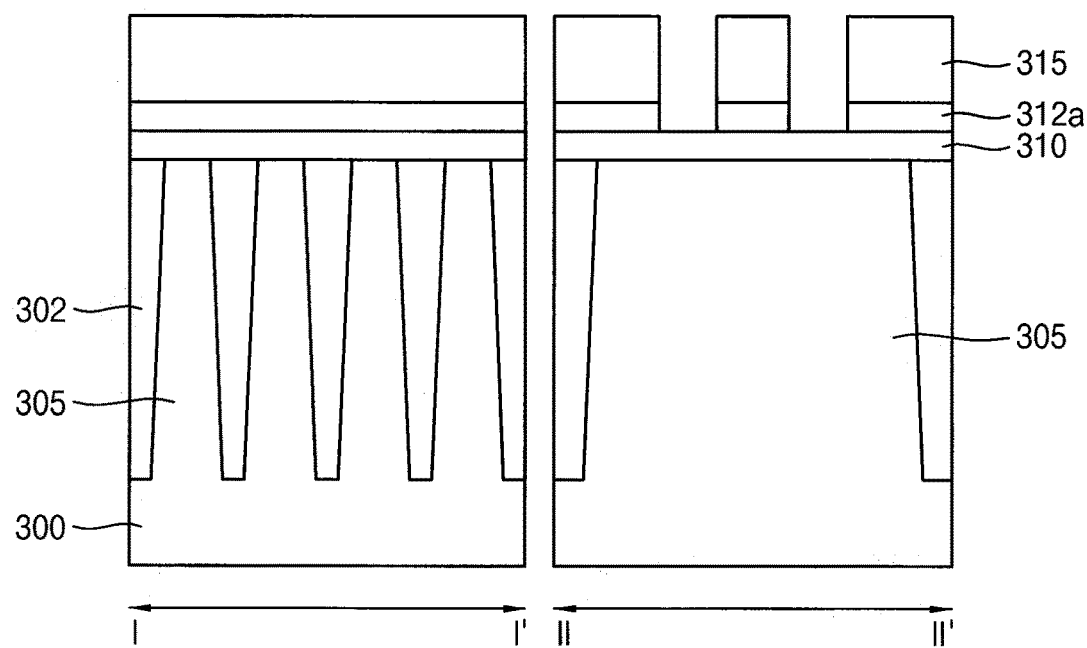

Referring to FIG. 21, processes substantially the same as or similar to those illustrated with reference to FIGS. 5 and 6 may be performed.

For example, the exposed portion 313 may be selectively removed using a developer solution such as TMAH. The underlayer 312 may be partially removed using the remaining non-exposed portion 315 as a photoresist pattern to form an underlayer pattern 312a.

Figure 22:
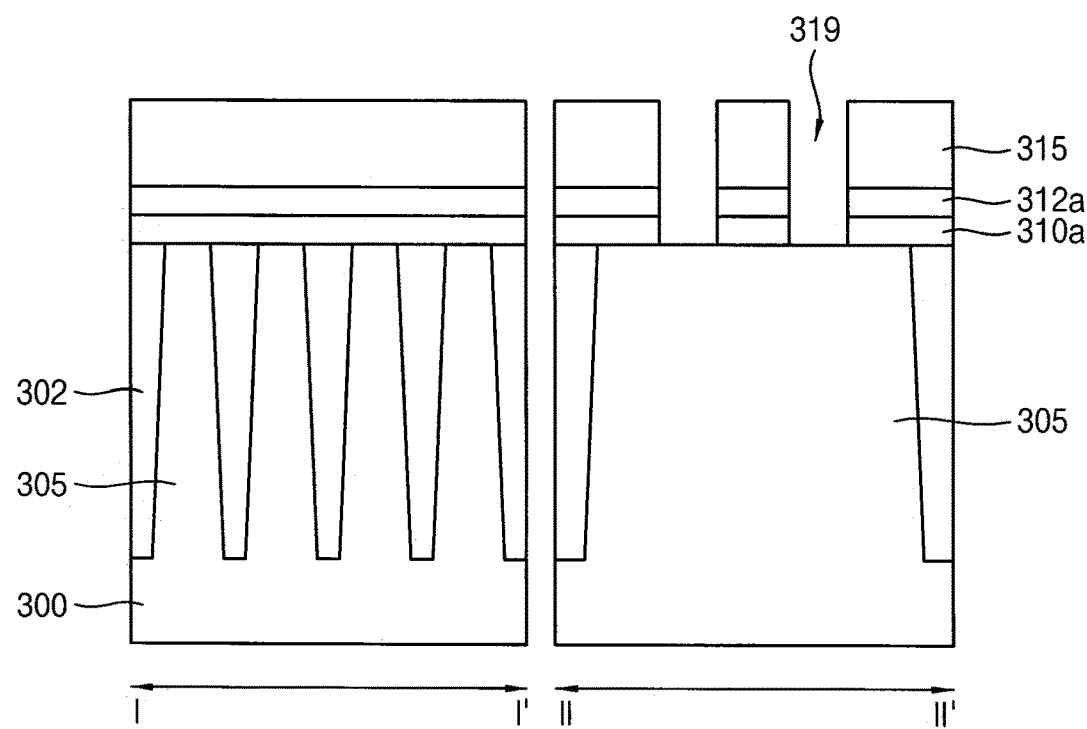

Referring to FIG. 22, the etch-stop layer 310 may be partially removed using the non-exposed portion 315 and the underlayer pattern 312a substantially as an etching mask. Accordingly, an etch-stop layer pattern 310a may be formed beneath the underlayer pattern 312a, and an opening 319 exposing a top surface of the active pattern 305 may be formed.

In example embodiments, the opening 319 may extend in the first direction, and may expose top surfaces of the active patterns 305 and the isolation layer 302. A plurality of the openings 319 may be formed along the second direction. In some embodiments, as illustrated in FIG. 22, two openings 319 may extend over one active pattern 305.

Referring to FIG. 23, upper portions of the active patterns 305 and the isolation layer 302 may be etched through the openings 319 to form gate trenches 309 according to example embodiments.

The gate trenches 309 may be formed based on an arrangement of the openings 319. For example, the gate trench 309 may extend in the first direction through the upper portions of the active patterns 305 and the isolation layer 302. A plurality of the gate trenches 309 may be formed along the second direction. In some embodiments, two gate trenches 309 may be formed in one active pattern 305.

After forming the gate trenches 309, the non-exposed portion 315, the underlayer pattern 312a and the etch-stop layer pattern 310a may be removed by, e.g., an ashing process, a strip process and/or a CMP process.

Figure 25:
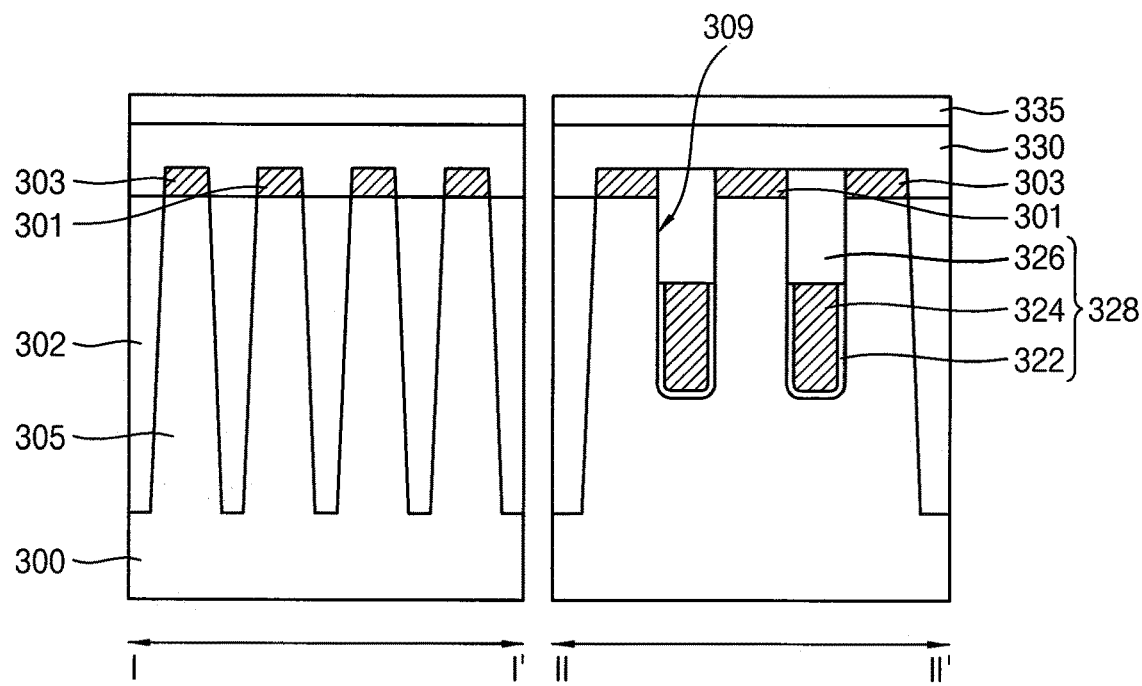

Referring to FIGS. 24 and 25, a gate structure 328 may be formed in the gate trench 309.

For example, a thermal oxidation process may be performed on surfaces of the active patterns 305 exposed by the gate trenches 309 to form a gate insulation layer. Alternatively, silicon oxide or a metal oxide may be deposited by, e.g., a CVD process on the surfaces of the active patterns 305 to form the gate insulation layer.

A gate conductive layer filling the gate trenches 309 may be formed on the gate insulation layer. The gate conductive layer and the gate insulation layer may be planarized by a CMP process until the top surface of the active pattern 305 may be exposed, and upper portions of the gate conductive layer and the gate insulation layer formed in the gate trench 309 may be partially removed by an etch-back process. Thus, a gate insulation pattern 322 and a gate electrode 324 filling a lower portion of the gate trench 309 may be formed.

The gate conductive layer may be formed of, e.g., a metal and/or a metal nitride by an ALD process or a sputtering process.

A gate mask layer filling a remaining portion of the gate trench 309 may be formed on the gate insulation pattern 322 and the gate electrode 324. An upper portion of the gate mask layer may be planarized until the top surface of the active pattern 305 may be exposed to form a gate mask 326. The gate mask layer may be formed of, e.g., silicon nitride by a CVD process.

Accordingly, the gate structure 328 including the gate insulation pattern 322, the gate electrode 324 and the gate mask 326 sequentially stacked in the gate trench 309 may be formed. According to the arrangement of the gate trenches 309 as described above, the gate structure 328 may extend in the first direction, and a plurality of the gate structures 328 may be formed along the second direction. The gate structure 328 may be buried in the active pattern 305. The upper portion of the active pattern 305 may be divided into a central portion between the gate structures 328, and two peripheral portions facing the central portion with respect to the gate structure 328.

Subsequently, an ion-implantation process may be performed on the upper portion of the active patterns 305 to form a first impurity region 301 and a second impurity region 303. For example, the first impurity region 301 may be formed at the central portion of the active pattern 305, and the second impurity region 303 may be formed at the peripheral portion (e.g., at both ends) of the active pattern 305.

In some embodiments, as illustrated in FIG. 25, an upper portion of the isolation layer 302 may be partially removed by an etch-back process to expose the upper portion of the active pattern 305, and then the ion-implantation process may be performed to form the impurity regions 301 and 303.

A capping layer 330 covering the active patterns 305 and the isolation layer 302 may be formed, and a first insulating interlayer 335 may be formed on the capping layer 330. For example, the capping layer 330 and the first insulating interlayer 335 may be formed of silicon nitride and silicon oxide, respectively. The capping layer 330 may substantially serve as an etch-stop layer for protecting the active pattern 305 during subsequent etching processes.

Figure 26:
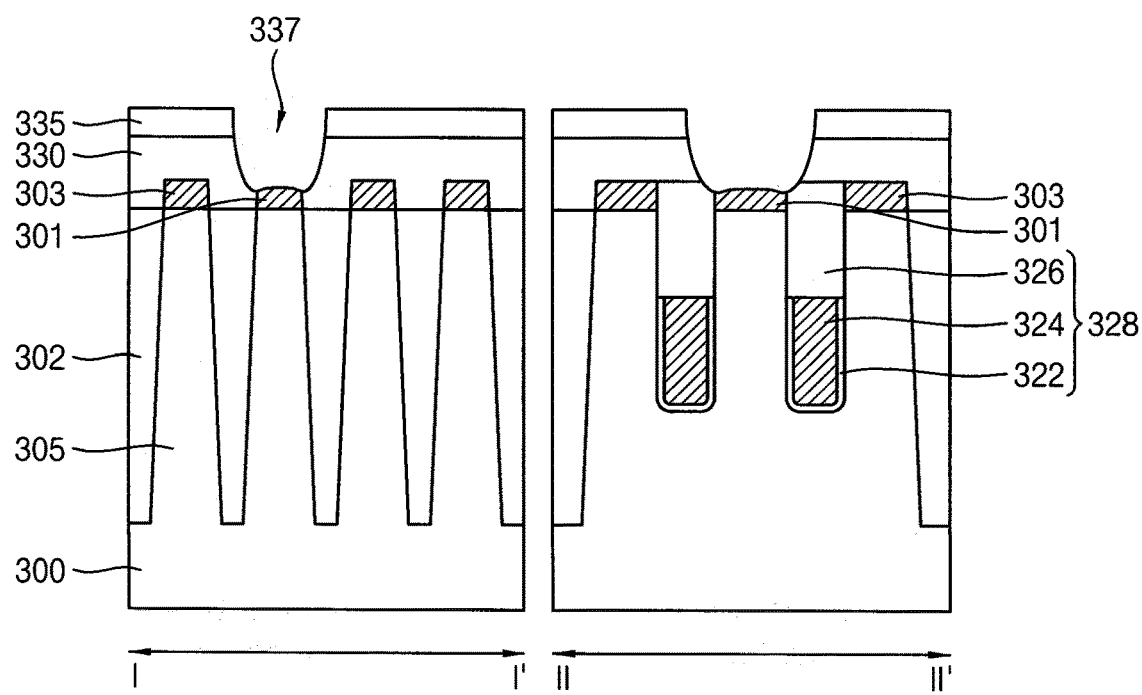

Referring to FIG. 26, the first insulating interlayer 335 and the capping layer 330 may be sequentially and partially etched to form a groove 337 through which the first impurity regions 301 may be exposed. The groove 337 may extend in the second direction, and a plurality of the grooves 337 may be formed along the first direction.

Referring to FIG. 27, a first conductive layer 340 filling the groove 337 may be formed on the first insulating interlayer 335. A barrier conductive layer 345 and a second conductive layer 347 may be sequentially formed on the first conductive layer 340, and a mask pattern 350 may be formed on the second conductive layer 347.

For example, the first conductive layer 340 may be formed using doped polysilicon, the barrier conductive layer 345 may be formed of a metal nitride or a metal silicide nitride, and the second conductive layer 347 may be formed using a metal. The first conductive layer 340, the barrier conductive layer 345 and the second conductive layer 347 may be formed by, e.g., a sputtering process, a PVD process or an ALD process.

The mask pattern 350 may include, e.g., silicon nitride, and may extend linearly in the second direction. A width of the mask pattern 350 (e.g., the width in the first direction) may be smaller than that of the groove 337 as shown in FIG. 26.

In some embodiments, the mask pattern 350 may be formed by a method of forming a pattern according to example embodiments. For example, a mask layer including silicon nitride may be formed on the second conductive layer 347. Processes substantially the same as or similar to those illustrated in FIGS. 2 to 8 may be performed using the mask layer as an object layer to form the mask pattern 350.

In a photo-lithography process for forming the mask pattern 350, an underlayer composition including a self-crosslinkable polymer according to example embodiments may be coated on the mask layer to form an underlayer. The underlayer may serve as an anti-reflection layer for the photo-lithography process.

Figure 29:
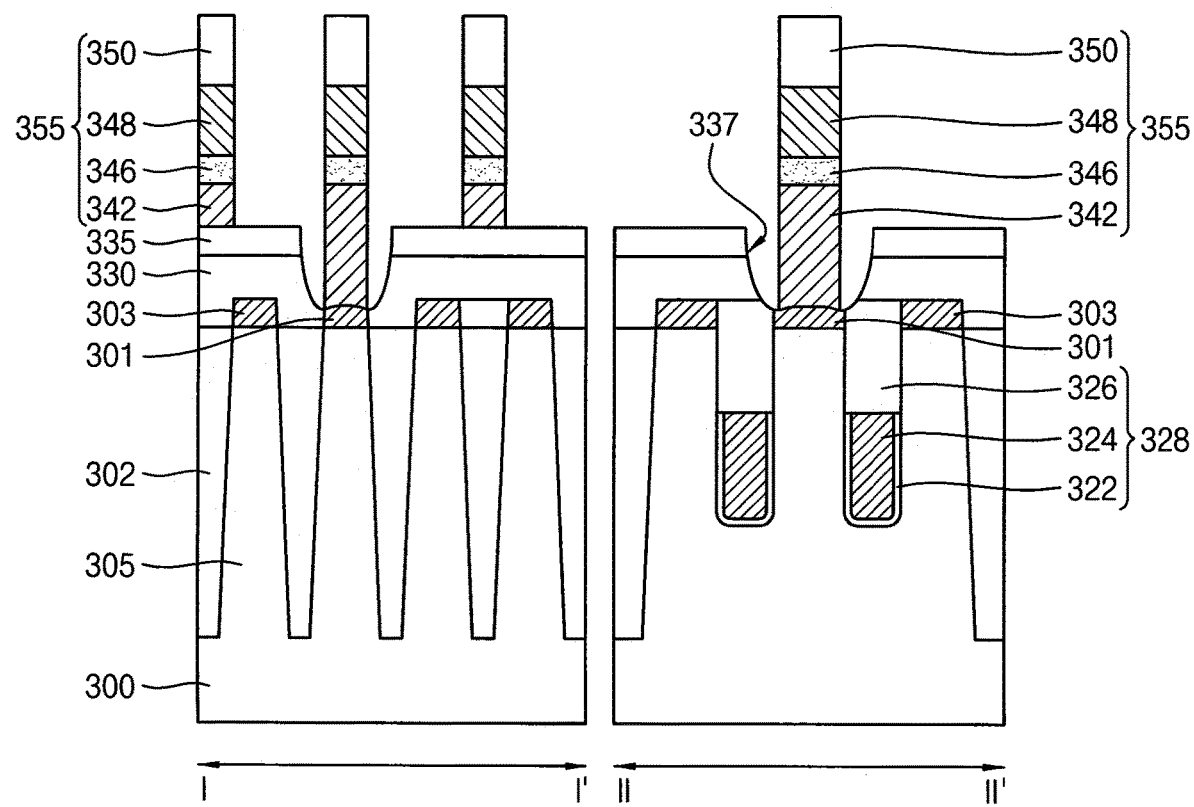

Referring to FIGS. 28 and 29, the second conductive layer 347, the barrier conductive layer 345 and the first conductive layer 340 may be sequentially etched using the mask pattern 350 as an etching mask. Accordingly, a first conductive pattern 342, a barrier conductive pattern 346 and a second conductive pattern 348 may be sequentially formed on the first impurity region 301. For convenience of descriptions, an illustration of the capping layer 330 and the first insulating interlayer 335 is omitted in FIG. 28.

Accordingly, a conductive line structure 355 extending in the second direction and including the first conductive pattern 342, the barrier conductive pattern 346, the second conductive pattern 348 and the mask pattern 350 may be formed on the first impurity region 301. In some embodiments, the conductive line structure 355 may serve as a bit line.

In some embodiments, the conductive line structure 355 may have a narrower width than that of the groove 337. Thus, a sidewall of the conductive line structure 355 may be spaced apart from a sidewall of the groove 337. In some embodiments, a distance between a sidewall of the conductive line structure 355 and a sidewall of the groove 337 near the first impurity region 301 is smaller in a first direction than a distance between a sidewall of the conductive line structure 355 and a sidewall of the groove 337 near the first insulating interlayer 335 in the first direction.

Figure 30:
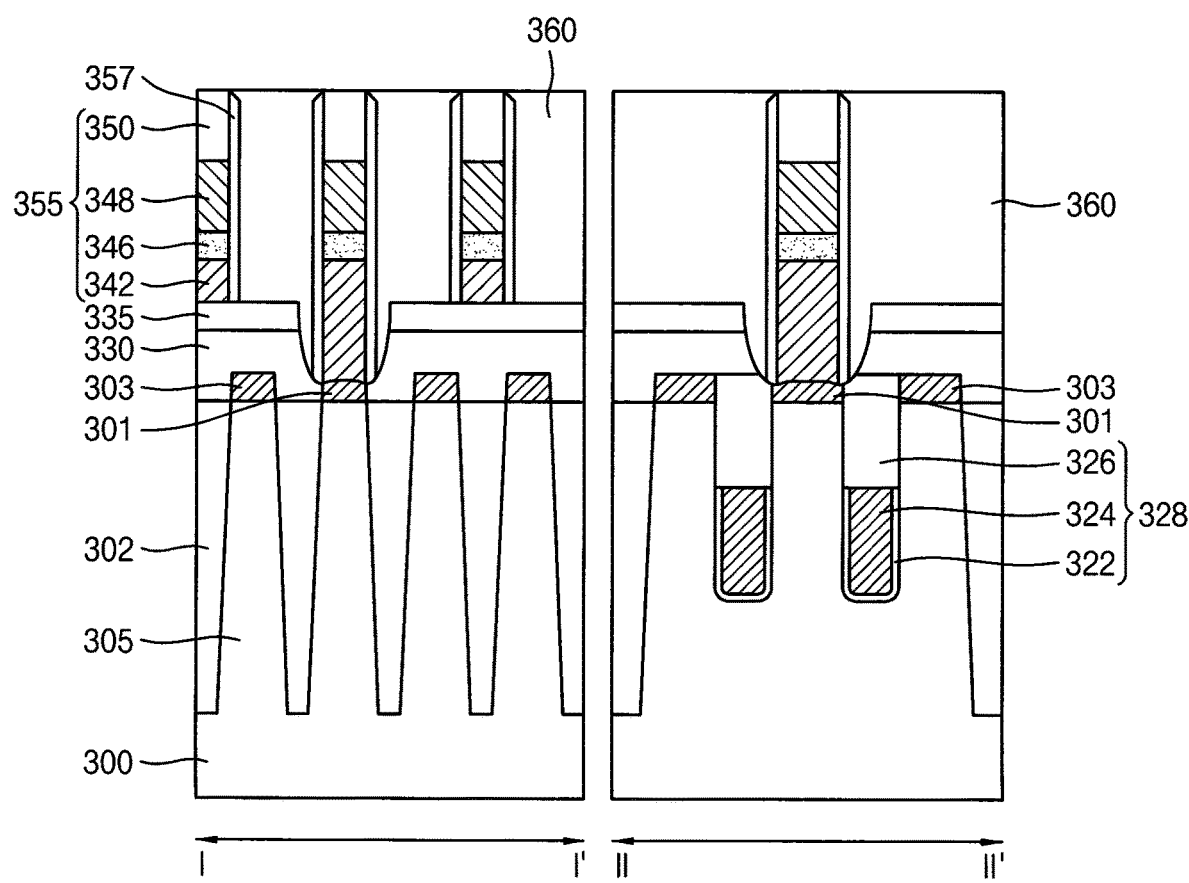

Referring to FIG. 30, a spacer 357 may be formed on the sidewall of the conductive line structure 355. For example, a spacer layer covering the conductive line structure 355 may be formed on the first insulating interlayer 335. The spacer layer may be anisotropically etched to form the spacer 357. The spacer layer may be formed of silicon nitride.

A second insulating interlayer 360 covering the conductive line structure 355 may be formed on the first insulating interlayer 335. The second insulating interlayer 360 may fill a remaining portion of the groove 337. The second insulating interlayer 360 may be formed of silicon oxide substantially the same as or similar to that of the first insulating interlayer 335.

In some embodiments, an upper portion of the second insulating interlayer 360 may be planarized by a CMP process such that a top surface of the mask pattern 350 may be exposed.

Figure 31:
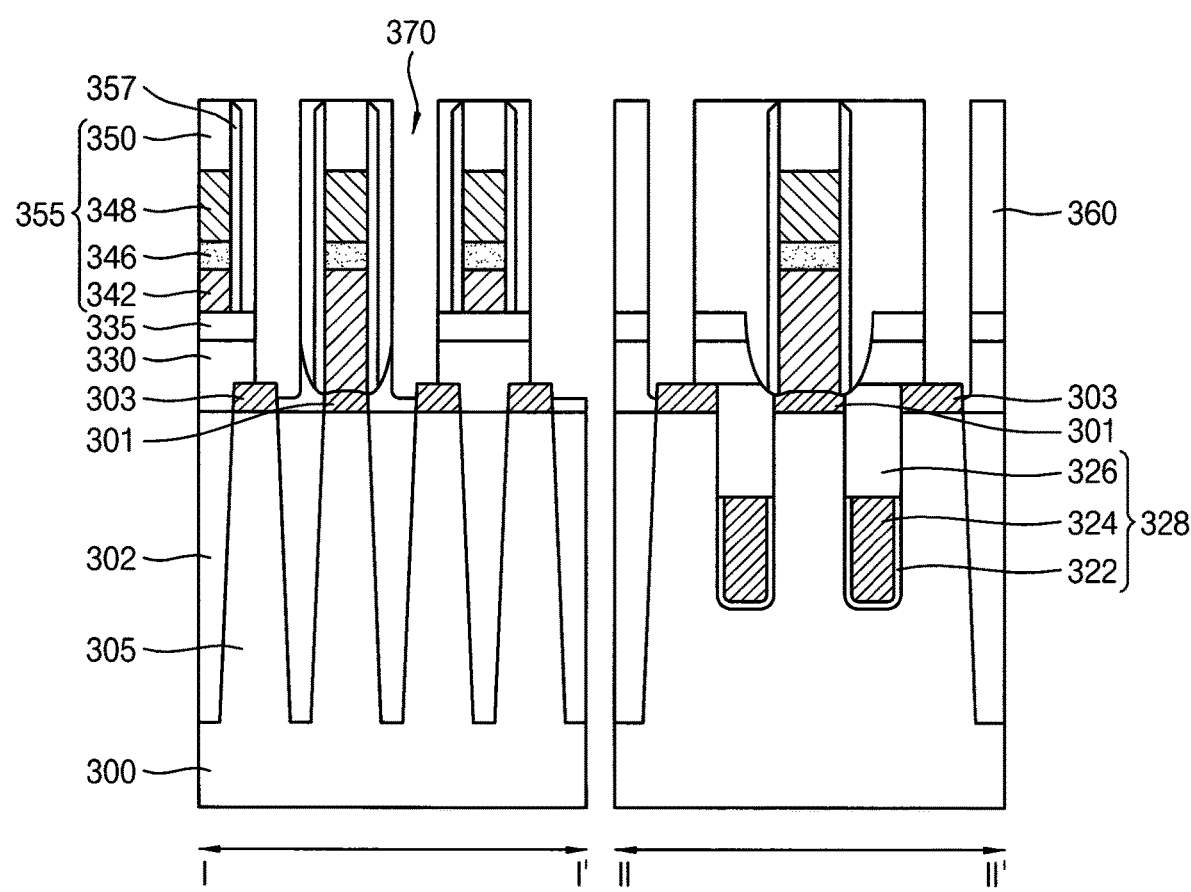

Referring to FIG. 31, the second insulating interlayer 360, the first insulating interlayer 335 and the capping layer 330 may be partially etched to form a contact hole 370 through which the second impurity region 303 may be exposed. The contact hole 370 may be formed per each hole formation area 356 indicated in FIG. 28.

In some embodiments, the contact hole 370 may be formed by a method of forming a pattern according to example embodiments. For example, an underlayer and a photoresist layer may be formed on the second insulating interlayer 360 and the mask pattern 350 as illustrated with reference to FIGS. 2 and 3. Subsequently, processes substantially the same as or similar to those illustrated with reference to FIGS. 4 to 8 may be performed using the second insulating interlayer 360 as an object layer to form the contact hole 370.

Figure 32:
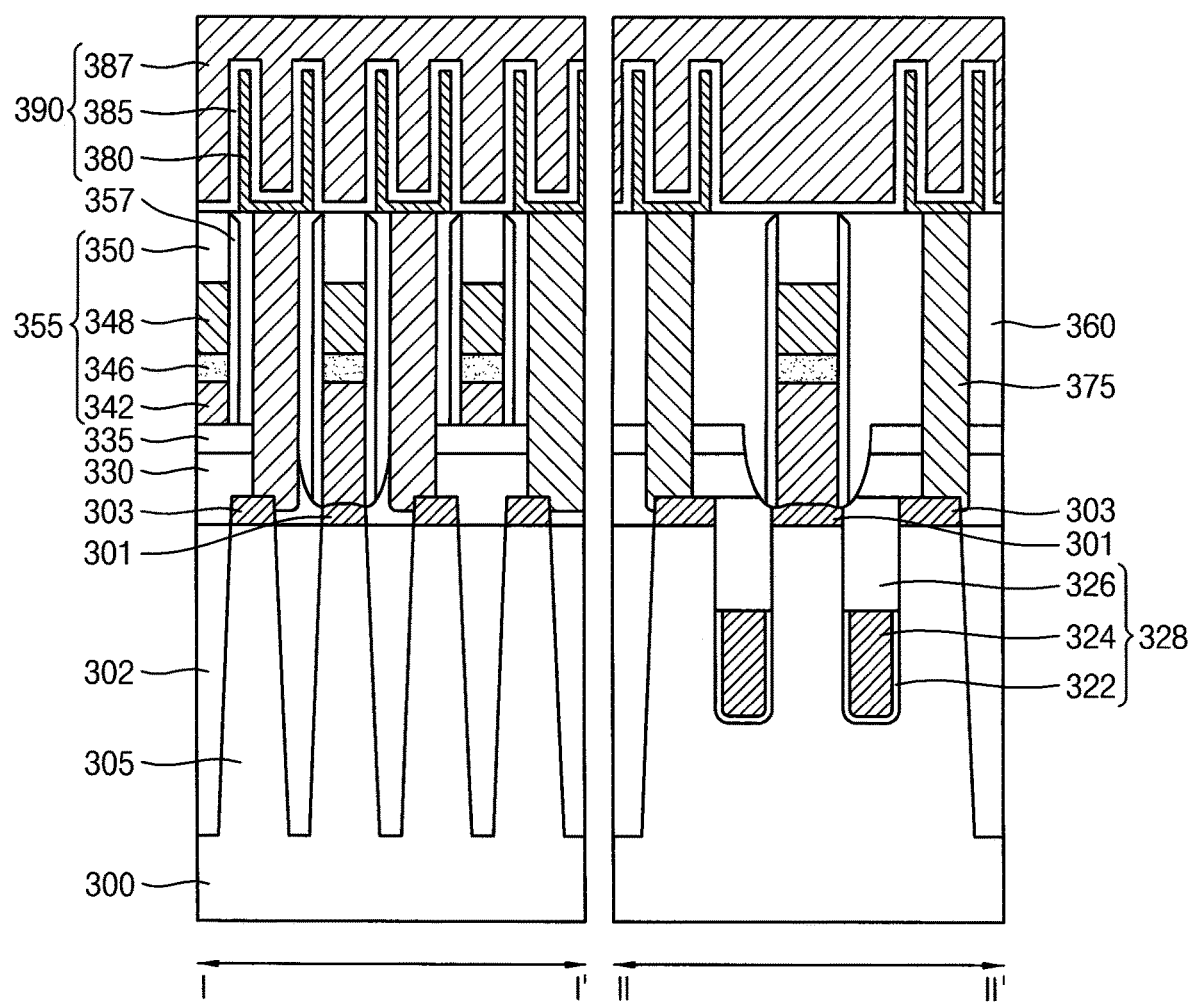

Referring to FIG. 32, a conductive contact 375 may be formed in the contact hole 370 to be electrically connected to or in contact with the second impurity region 303. A capacitor 390 may be formed on the conductive contact 375. In this case, the conductive contact 375 may serve as a capacitor contact.

For example, a conductive layer filling the contact holes 370 may be formed on the second impurity region 303, the mask pattern 350 and the second insulating interlayer 360. An upper portion of the conductive layer may be planarized by a CMP process until the top surface of the mask pattern 350 is exposed to form the conductive contact 375 filling each contact hole 370.

The conductive layer may be formed of a metal such as copper, tungsten, aluminum by a sputtering process, a PVD process, an ALD process, a CVD process, etc. In some embodiments, the conductive layer may be formed by an electroplating process or an electroless plating process. In an embodiment, a barrier conductive layer including, e.g., titanium or titanium nitride may be formed on an inner wall of the contact hole 370 before forming the conductive layer.

The capacitor 390 electrically connected to the conductive contact 375 may be formed on the second insulating interlayer 360. Accordingly, a dynamic random access memory (DRAM) device including the BCAT structure may be obtained.

For example, an etch-stop layer and a mold layer (not illustrated) may be formed on the mask pattern 350, the second insulating interlayer 360 and the conductive contact 375. The mold layer and the etch-stop layer may be partially removed to form a capacitor opening through which a top surface of the conductive contact 375 may be exposed.

A lower electrode layer may be formed along an inner wall of the capacitor opening and a top surface of the mold layer. A sacrificial layer (not illustrated) may be formed on the lower electrode layer, and upper portions of the sacrificial layer and the lower electrode layer may be planarized such that the top surface of the mold layer is exposed. The sacrificial layer and the mold layer may be removed to form the lower electrode 380.

A dielectric layer 385 may be formed along surfaces of the etch-stop layer and the lower electrode 380, and an upper electrode 387 may be formed on the dielectric layer 385 to form the capacitor 390. The dielectric layer 385 may be formed of silicon oxide or a high-k metal oxide. The lower electrode 380 and the upper electrode 387 may be formed of a metal or a metal nitride such as tungsten, tungsten nitride, titanium, titanium nitride, tantalum, tantalum nitride or ruthenium.

In some embodiments, a magnetic tunnel junction (MTJ) structure may be formed on the conductive contact 375. For example, the MTJ structure may include a pinned layer, a tunnel barrier layer and a free layer stacked on each other. The MTJ structure may be interposed between a lower electrode and an upper electrode such that a memory cell may be defined. The memory cell may be disposed on the conductive contact 375. In this case, the semiconductor device may be a magnetic random access memory (MRAM) device including the BCAT structure.

Hereinafter, properties of underlayers according to example embodiments will be described in more detail with reference to experimental examples.

Preparations of Self-Crosslinkable Polymer/Underlayer Compositions

Synthetic Example 1: Synthesis of Chemical Formula 1-1

26.1 g of tris(2-hydroxyethyl)isocyanurate, 26.1 g of 1,3,5-tris(methoxymethyl)isocyanurate, and 104 g of acetonitrile were mixed in a reactor, and stirred at 85° C. for 30 minutes. After solids in the reactor were melted to form a reaction solution, 0.2 g of para-toluene sulfonic acid was added, and further reacted for 10 hours. The reaction solution was cooled to a room temperature (25° C.), and then 5 g of Amberite A21 was added and stirred at a room temperature for an hour. The resultant reaction solution was filtered, and slowly dropped in diethyl ether. Precipitates were collected and dried to achieve a self-crosslinkable polymer including the repeating unit represented by the Chemical Formula 1-1 above (Mw (weight average molecular weight): 1840, PDI (polydispersity index): 1.5).

Synthetic Example 2: Synthesis of Chemical Formula 1-1

Procedures of Synthetic Example 1 were repeated except that 17.2 g of 1,3,5-tris(methoxymethyl)isocyanurate was used to obtain a self-crosslinkable polymer including the repeating unit represented by the Chemical Formula 1-1 above (Mw: 1950, PDI: 1.4).

Synthetic Example 3: Synthesis of Chemical Formula 1-1

Procedures of Synthetic Example 1 were repeated except that 20.8 g of tris(2-hydroxyethyl)isocyanurate, and 31.3 g of 1,3,5-tris(methoxymethyl)isocyanurate were used to obtain a self-crosslinkable polymer including the repeating unit represented by the Chemical Formula 1-1 above (Mw: 1900, PDI: 1.4).

Synthetic Example 4: Synthesis of Chemical Formula 1-1

Procedures of Synthetic Example 1 were repeated except that 13.1 g of tris(2-hydroxyethyl)isocyanurate, and 30.3 g of 1,3,5-tris(methoxymethyl)isocyanurate were used to obtain a self-crosslinkable polymer including the repeating unit represented by the Chemical Formula 1-1 above (Mw: 1650, PDI: 1.3).

Synthetic Example 5: Synthesis of Chemical Formula 1-2

Procedures of Synthetic Example 1 were repeated except that 27.5 g of 1-methyl-3,5-di(2-hydroxyethyl)isocyanurate was used instead of 26.1 g of tris(2-hydroxyethyl)isocyanurate, and 20.9 g of 1,3,5-tris(methoxymethyl)isocyanurate was used to obtain a self-crosslinkable polymer including the repeating unit represented by the Chemical Formula 1-2 above (Mw: 1600, PDI: 1.5).

Synthetic Example 6: Synthesis of Chemical Formula 1-2

Procedures of Synthetic Example 1 were repeated except that 22.9 g of 1-methyl-3,5-di(2-hydroxyethyl)isocyanurate was used instead of 26.1 g of tris(2-hydroxyethyl)isocyanurate to obtain a self-crosslinkable polymer including the repeating unit represented by the Chemical Formula 1-2 above (Mw: 3540, PDI: 1.6).

Synthetic Example 7: Synthesis of Chemical Formula 1-2

Procedures of Synthetic Example 1 were repeated except that 18.3 g of 1-methyl-3,5-di(2-hydroxyethyl)isocyanurate was used instead of 26.1 g of tris(2-hydroxyethyl)isocyanurate, and 31.3 g of 1,3,5-tris(methoxymethyl)isocyanurate was used to obtain a self-crosslinkable polymer including the repeating unit represented by the Chemical Formula 1-2 above (Mw: 1980, PDI: 1.6).

Synthetic Example 8: Synthesis of Chemical Formula 1-3

Procedures of Synthetic Example 1 were repeated except that 13.1 g of tris(2-hydroxyethyl)isocyanurate and 11.5 g of 1-methyl-3,5-di(2-hydroxyethyl)isocyanurate were used instead of 26.1 g of tris(2-hydroxyethyl)isocyanurate to obtain a self-crosslinkable polymer including the repeating unit represented by the Chemical Formula 1-3 above (Mw: 2460, PDI: 1.4).

Synthetic Example 9: Synthesis of Chemical Formula 2

Procedures of Synthetic Example 1 were repeated except that 13.1 g of 1,3,5-tris(methoxymethyl)-isocyanurate and 11.5 g of 1-methyl-3,5-di(methoxymethyl)-isocyanurate were used instead of 26.1 g of 1,3,5-tris(methoxymethyl)-isocyanurate to obtain a self-crosslinkable polymer including the repeating unit represented by the Chemical Formula 2 above (Mw: 1810, PDI: 1.4).

Synthetic Example 10: Synthesis of Chemical Formula 2

Procedures of Synthetic Example 1 were repeated except that 19.6 g of 1,3,5-tris(methoxymethyl)-isocyanurate and 5.7 g of 1-methyl-3,5-di(methoxymethyl)-isocyanurate were used instead of 26.1 g of 1,3,5-tris(methoxymethyl)-isocyanurate to obtain a self-crosslinkable polymer including the repeating unit represented by the Chemical Formula 2 above (Mw: 2250, PDI: 1.4).

Synthetic Example 11: Synthesis of Chemical Formula 1-4

26.1 g of tris(2-hydroxyethyl)isocyanurate, 26.1 g of 1,3,5-tris(methoxymethyl)-isocyanurate, and 104 g of acetonitrile were mixed in a reactor, and stirred at 85° C. for 30 minutes. After solids in the reactor were melted to form a reaction solution, 0.2 g of para-toluene sulfonic acid was added, and further reacted for 10 hours. The reaction solution was cooled to a room temperature (25° C.), and then 5 g of Amberite A21 was added and stirred at a room temperature for an hour. The resultant reaction solution was filtered, and slowly dropped in diethyl ether. Precipitates were collected and dried to achieve a polymer including the repeating unit represented by the Chemical Formula 1-1 above. 20 g of the obtained polymer was dissolved in 100 g of THF, and the solution was cooled below 5° C. 5 g of triethylamine was added to the solution, and stirred for 30 minutes. 4.25 g of acetyl chloride was further added, and reacted at a room temperature for 12 hours. The resultant solution was precipitated using 1-heptane solution to achieve a self-crosslinkable polymer including the repeating unit represented by the Chemical Formula 1-4 above.

Synthesis of an ARC Polymer Resin (First Resin)

29.8 g of triglycidyl isocyanurate, 7.2 g of acetic acid, 1.1 g of benzyltriethylammonium chloride, and 100 g of propylene glycol monoethyl ether (PGME) were mixed in a reactor of 250 ml. The reactor was heated to 110° C., and the mixture was reacted for 3 hours. 11.8 g of butandionic acid was added to the reactor, and reacted for another 3 hours. The resultant mixture was cooled to a room temperature, and precipitated and filtered in an excess methanol solution to achieve a polymer resin. The polymer resin was dried in an oven at a 40° C. (Mw: 2830, PDI: 1.4).

Synthesis of an ARC Polymer Resin (Second Resin)

29.8 g of triglycidyl isocyanurate, 7.2 g of acetic acid, 1.1 g of benzyltriethylammonium chloride, and 100 g of PGME were mixed in a reactor of 250 ml. The reactor was heated to 110° C., and the mixture was reacted for 3 hours. 14.3 g of monomethyl isocyanuric acid was added to the reactor, and reacted for another 3 hours. The resultant mixture was cooled to a room temperature, and precipitated and filtered in an excess methanol solution to achieve a polymer resin. The polymer resin was dried in an oven at a 40° C. (Mw: 4420, PDI: 1.8).

Formation of Anti-Reflection Layers

The polymers obtained by Synthetic Examples and triethyl ammonium triflate as a thermal acid generator (TAG) were dissolved in 1:1 mixture of propylene glycol monoethyl ether and methyl 2-hydroxy isobutyrate as a solvent, and filtered through 0.45 μm filter to form underlayer compositions according to Examples. 0.9 g of the ARC polymer resin (the first resin and the second resin), 0.10 g of Powderlink 1174 as a cross-linking agent, and 0.05 g of triethyl ammonium triflate (TAG) were dissolved in 99.0 g of the solvent the same as that of Examples, and filtered through 0.45 μm filter to form underlayer compositions according to Comparative Examples 1 and 2.

The underlayer compositions of Examples and Comparative Examples were coated on a silicon wafer, and baked at 205° C. for 60 seconds to form anti-reflection layers having a thickness of 230 Å.

Component contents of the compositions are shown in Table 1 below.

TABLE 1

| | Self-crosslinkable Polymer | | ARC Polymer | Cross-linking | | |
|---|---|---|---|---|---|---|
| | Synthesis | Amount (g) | Resin (g) | TAG (g) | Agent (g) | Solvent (g) |
| Example 1 | Synthetic Example 1 | 1.0 | | 0.05 | | 99.0 |
| Example 2 | Synthetic Example 2 | 1.0 | | 0.05 | | 99.0 |
| Example 3 | Synthetic Example 3 | 1.0 | | 0.05 | | 99.0 |
| Example 4 | Synthetic Example 4 | 1.0 | | 0.05 | | 99.0 |
| Example 5 | Synthetic Example 5 | 1.0 | | 0.05 | | 99.0 |
| Example 6 | Synthetic Example 6 | 1.0 | | 0.05 | | 99.0 |
| Example 7 | Synthetic Example 7 | 1.0 | | 0.05 | | 99.0 |
| Example 8 | Synthetic Example 8 | 1.0 | | 0.05 | | 99.0 |
| Example 9 | Synthetic Example 9 | 1.0 | | 0.05 | | 99.0 |
| Example 10 | Synthetic Example 10 | 1.0 | | 0.05 | | 99.0 |
| Example 11 | Synthetic Example 11 | 1.0 | | 0.05 | | 99.0 |
| Example 12 | Synthetic Example 1 | 0.3 | 0.7 | 0.05 | | 99.0 |
| Example 13 | Synthetic Example 1 | 0.5 | 0.5 | 0.05 | | 99.0 |
| Example 14 | Synthetic Example 1 | 0.7 | 0.3 | 0.05 | | 99.0 |
| Example 15 | Synthetic Example 2 | 0.5 | 0.5 | 0.05 | | 99.0 |
| Example 16 | Synthetic Example 8 | 0.5 | 0.5 | 0.05 | | 99.0 |
| Example 17 | Synthetic Example 1 | 1.0 | | | | 99.0 |
| Comparative Example 1 | | | (First Resin) 0.9 | 0.05 | 0.1 | 99.0 |
| Comparative Example 2 | | | (Second Resin) 0.9 | 0.05 | 0.1 | 99.0 |

Experimental Example 1

The anti-reflection layers of Examples and Comparative Examples were immersed in a PGME solution. Thickness differences before and after the immersion were measured to evaluate chemical resistance of the anti-reflection layers.

Experimental Example 2

The anti-reflection layers of Examples and Comparative Examples were etched using an etching apparatus (Exelan HPT manufactures by Lam Research Co.) and using a mixture gas of Ar, $O_2$ and $CF_4$ for 10 seconds, and then thicknesses of the layers were measured to evaluate etching rates (Å/sec) with respect to the anti-reflection layers.

Further, refractive indexes and absorbance coefficients of the anti-reflection layers were measured at a wavelength of 193 nm using an ellipsometer apparatus (VUV-303 manufactures by J.A. Woolam)

Results from Experimental Examples 1 and 2 are shown in Table 2 below.

TABLE 2

|  | Layer Loss (Å) | Refractive Index | Absorbance Coefficient | Etching Rate |
|---|---|---|---|---|
| Example 1 | 0.95 | 1.98 | 0.26 | 1.23 |
| Example 2 | 1.33 | 1.97 | 0.25 | 1.20 |
| Example 3 | 1.68 | 1.94 | 0.28 | 1.16 |
| Example 4 | 1.23 | 1.94 | 0.27 | 1.24 |
| Example 5 | 2.89 | 1.96 | 0.27 | 1.10 |
| Example 6 | 1.05 | 1.94 | 0.27 | 1.08 |
| Example 7 | 1.94 | 1.98 | 0.26 | 1.11 |
| Example 8 | 3.50 | 1.94 | 0.24 | 1.14 |
| Example 9 | 2.11 | 1.95 | 0.30 | 1.09 |
| Example 10 | 1.94 | 1.95 | 0.28 | 1.19 |
| Example 11 | 1.64 | 1.95 | 0.29 | 1.12 |
| Example 12 | 0.59 | 1.94 | 0.30 | 1.02 |
| Example 13 | 3.64 | 1.95 | 0.27 | 1.06 |
| Example 14 | 2.33 | 1.97 | 0.26 | 1.11 |
| Example 15 | 4.12 | 1.95 | 0.28 | 1.10 |
| Example 16 | 1.06 | 1.96 | 0.28 | 1.08 |
| Example 17 | 3.67 | 1.99 | 0.26 | 1.25 |
| Comparative Example 1 | 2.61 | 1.92 | 0.27 | 1 |
| Comparative Example 2 | 5.61 | 1.91 | 0.26 | 1.02 |

Referring to Table 2, the thickness differences (layer losses) before and after the immersion of the anti-reflection layers of Examples were within 5 Å. In Comparative Example 2 (isocyanurate units in the anti-reflection layer are connected via carbon atoms), the layer loss was relatively severe. Compared to Comparative Example 2, isocyanurate units are connected via oxygen atoms in the anti-reflection layers of Examples.

The anti-reflection layers of Examples had high refractive indexes equal to or greater than 1.94. The etching rates measured in Examples were greater than those in Comparative Examples 1 and 2. Thus, the anti-reflection layers of Examples may be easily removed after a photo-lithography process.

Experimental Example 3

DARC-A125 (manufactured by DONGJIN SEMICHEM CO.) was spin-coated on a silicon wafer, and baked at 240° C. for 60 seconds to form a layer having a thickness of 440 Å. The anti-reflection layers of Examples and Comparative Examples were formed on the layer. A photoresist (DHA-HD150 manufactured by DONGJIN SEMICHEM CO.) was coated on each anti-reflection layer to have a thickness of 1300 Å, and then soft-baked at 110° C. for 60 seconds. An exposure process was performed using an ArF exposure apparatus (ASML 1200B, 0.85NA, 193 nm), and then a PEB process was performed at 120° C. for 80 seconds. A developing process was performed using a TMAH solution (2.38%) to form patterns having a line width of 70 nm and a line/space (L/S) 1:1.25. Pattern profiles (cross-sectional profiles) were observed using a scanning electron microscope, and a depth of focus (DOF) of each pattern was measured. The results are shown in Table 3 below.

TABLE 3

|  | Pattern Profile | DOF margin (nm) |
|---|---|---|
| Example 1 | vertical shape | 240 |
| Example 2 | vertical shape | 240 |
| Example 3 | vertical shape | 240 |
| Example 4 | vertical shape | 220 |
| Example 5 | vertical shape | 240 |
| Example 6 | vertical shape | 200 |
| Example 7 | vertical shape | 200 |
| Example 8 | vertical shape | 240 |
| Example 9 | vertical shape | 220 |
| Example 10 | vertical shape | 220 |
| Example 11 | vertical shape | 200 |
| Example 12 | vertical shape | 240 |
| Example 13 | vertical shape | 240 |
| Example 14 | vertical shape | 240 |
| Example 15 | vertical shape | 240 |
| Example 16 | vertical shape | 240 |
| Example 17 | vertical shape | 240 |
| Comparative Example 1 | Footing and scum were observed | 180 |
| Comparative Example 2 | Footing and scum were observed | 200 |

Referring to Table 3, pattern defects due to a reflected light were suppressed or reduced in the anti-reflection layers of Examples having high refractive indexes. DOF margins of the anti-reflection layers of Examples were greater than those of Comparative Examples 1 and 2. Thus, the anti-reflection layers of Examples also had improved optical properties.

According to example embodiments of the present inventive concepts, a composition for an underlayer of photoresist may include a self-crosslinkable polymer and a solvent. A repeating unit of the self-crosslinkable polymer may include at least two isocyanurate units connected to each other which may have different side chain moieties. A self-cross-linking may occur between the isocyanurate units by a heat to form an underlayer without using a cross-linking agent in the composition. Therefore, defects such as an outgassing caused by the cross-linking agent may be avoided. The underlayer formed by the isocyanurate units may have a high refractive index so that a reflected light during an exposure process may be effectively absorbed or scattered. The composition according to example embodiments may be applied to a high resolution photo-lithography process for forming a fine wiring, a contact, an insulation pattern, etc., included in various semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

We claim:
1. A method of forming a pattern, comprising:
preparing a composition that includes a solvent and a polymer including a repeating unit in which at least one isocyanurate unit having a first structure is connected to another isocyanurate unit having a second structure different from the first structure;
applying the composition on a substrate to form an underlayer;
forming a photoresist layer on the underlayer;
etching the photoresist layer to form a photoresist pattern; and
patterning the substrate or a layer on the substrate using the photoresist pattern,
wherein the repeating unit is represented by Chemical Formula 1:

Chemical Formula 1

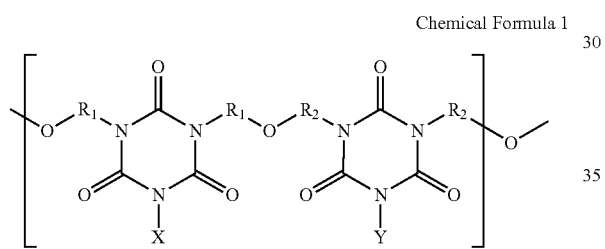

wherein, in Chemical Formula 1, $R_1$ and $R_2$ each independently represents a $C_1$-$C_{10}$ chain-shaped or ring-shaped hydrocarbon group, and the hydrocarbon group is saturated or includes at least one unsaturated bond,
wherein X and Y each represents the self-crosslinking side chain moiety, X and Y each independently represents a $C_1$-$C_{12}$ chain-shaped or ring-shaped hydrocarbon group, at least one of X or Y includes a hetero atom, and X and Y are different from each other.

2. The method according to claim 1, wherein the repeating unit includes at least one of structures represented by Chemical Formulae 1-1 to 1-4:

[Chemical Formula 1-1]

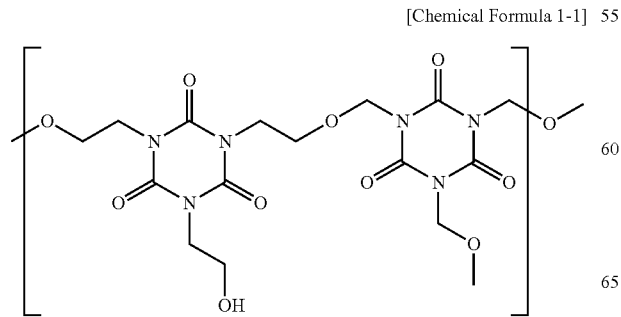

[Chemical Formula 1-2]

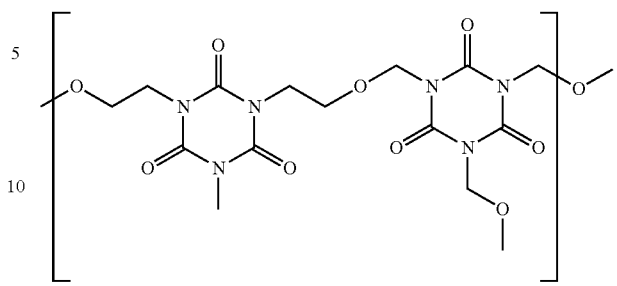

[Chemical Formula 1-3]

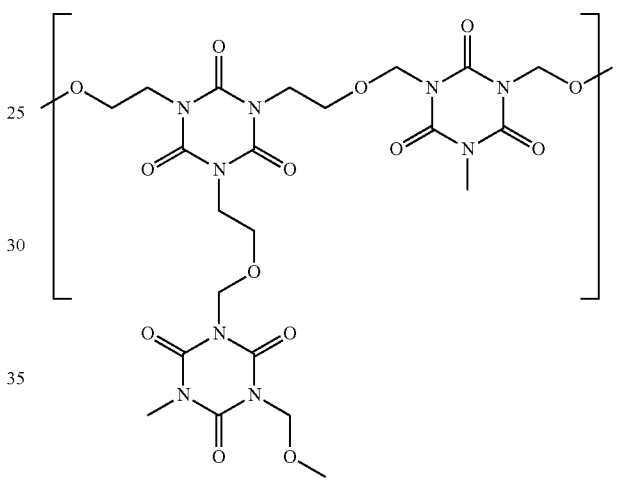

[Chemical Formula 1-4]

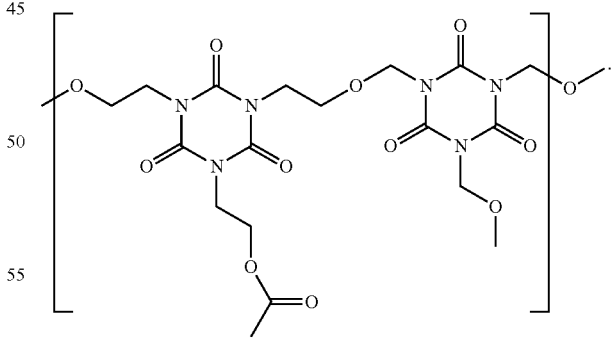

3. The method according to claim 1, wherein the repeating unit includes at least three isocyanurate units.

4. The method according to claim 3, wherein the repeating unit is represented by Chemical Formula 2:

Chemical Formula 2

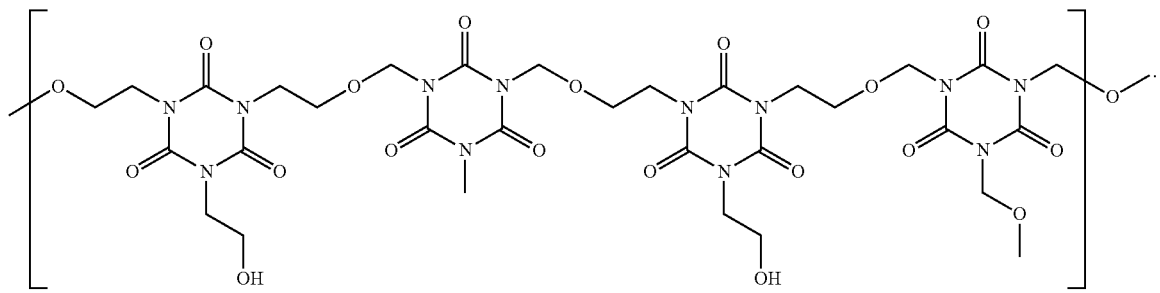

5. The method according to claim 1, further comprising preparing an acid generator.

6. The method according to claim 5, wherein the composition consists of the self-crosslinkable polymer, the acid generator and the solvent, and is devoid of a cross-linking agent.

7. A method of forming a pattern, comprising:
preparing a composition that includes a self-crosslinkable polymer including a repeating unit in which at least one isocyanurate unit having a first structure is connected to another isocyanurate unit having a second structure different from the first structure, and a solvent;
coating the composition on an object layer to form an underlayer;
forming a photoresist layer on the underlayer;
performing an exposure process on the photoresist layer such that the photoresist layer is divided into an exposed portion and a non-exposed portion;
removing one of the exposed portion or the non-exposed portion to form a photoresist pattern; and
patterning the object layer using the photoresist pattern,
wherein the repeating unit is represented by Chemical Formula 1:

Chemical Formula 1

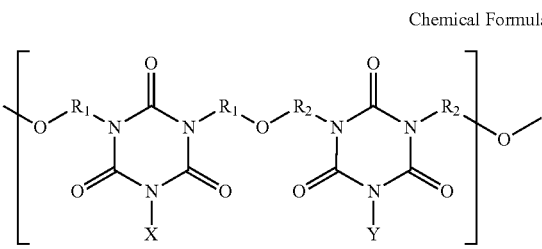

wherein, in Chemical Formula 1, $R_1$ and $R_2$ each independently represents a $C_1$-$C_{10}$ chain-shaped or ring-shaped hydrocarbon group, and the hydrocarbon group is saturated or includes at least one unsaturated bond,
wherein X and Y each represents the self-crosslinking side chain moiety, X and Y each independently represents a $C_1$-$C_{12}$ chain-shaped or ring-shaped hydrocarbon group, at least one of X or Y includes a hetero atom, and X and Y are different from each other.

8. The method of claim 7, wherein a refractive index of the underlayer exceeds about 1.9.

9. The method of claim 8, wherein the refractive index of the underlayer is in a range from about 1.94 to about 2.

10. The method of claim 7, wherein the exposure process is performed using an ArF light source and an ArF immersion light source.

11. The method of claim 7, wherein forming the underlayer includes thermally cross-linking the self-crosslinkable polymer included in the composition.

12. The method of claim 11, wherein thermally cross-linking includes a baking process performed at a temperature from about 150° C. to about 250° C.

13. The method according to claim 7, wherein the repeating unit includes at least one of structures represented by Chemical Formulae 1-1 to 1-4:

[Chemical Formula 1-1]

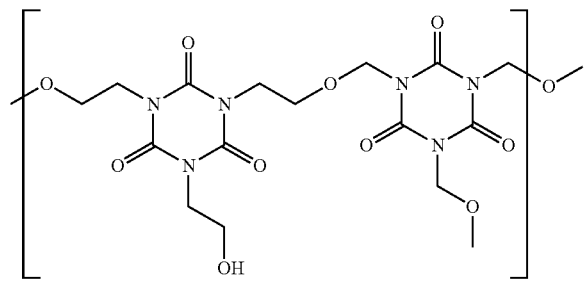

[Chemical Formula 1-2]

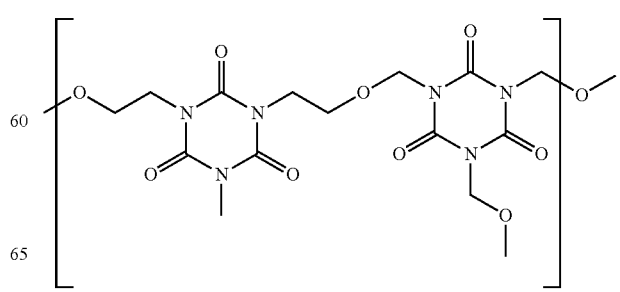

-continued

[Chemical Formula 1-3]

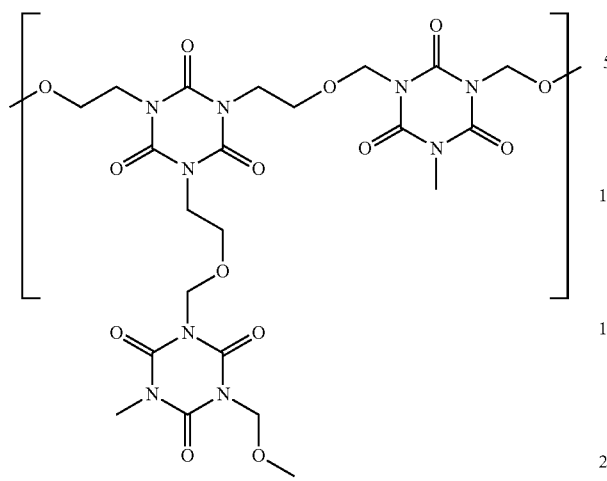

[Chemical Formula 1-4]

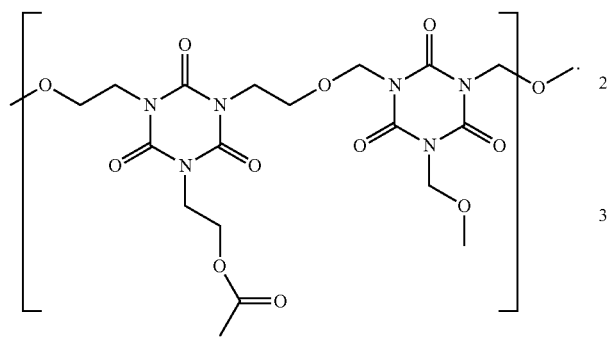

14. A method of forming a pattern for a semiconductor device, comprising:
    preparing an underlayer composition that includes a solvent and a polymer including a repeating unit having a plurality of isocyanurate units in which at least one isocyanurate unit having a first chemical composition is connected to another isocyanurate unit having a second chemical composition different from the first chemical composition;
    applying the underlayer composition on a semiconductor substrate to form an underlayer;
    forming a photoresist layer on the underlayer;
    etching a portion of the photoresist layer to form a photoresist pattern; and
        patterning the semiconductor substrate or a layer on the semiconductor substrate using the photoresist pattern,
    wherein the repeating unit is represented by Chemical Formula 1:

Chemical Formula 1

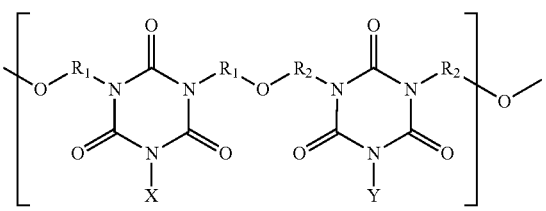

wherein, in Chemical Formula 1, $R_1$ and $R_2$ each independently represents a $C_1$-$C_{10}$ chain-shaped or ring-shaped hydrocarbon group, and the hydrocarbon group is saturated or includes at least one unsaturated bond, wherein X and Y each represents the self-crosslinking side chain moiety, X and Y each independently represents a $C_1$-$C_{12}$ chain-shaped or ring-shaped hydrocarbon group, at least one of X or Y includes a hetero atom, and X and Y are different from each other.

* * * * *